United States Patent [19]

Masuzima et al.

[11] 4,054,988
[45] Oct. 25, 1977

[54] MACHINE FOR PROCESSING AND SECURING PARALLEL LEAD ELECTRONIC CIRCUIT ELEMENTS TO A PRINTED CIRCUIT BOARD

[75] Inventors: Sho Masuzima; Tetsuo Takahashi; Yoshinobu Taguchi; Hisashi Fujita, all of Tokyo, Japan

[73] Assignee: Tokyo Denki Kagaku Kogyo Kabushiki Kaisha, Tokyo, Japan

[21] Appl. No.: 672,944

[22] Filed: Apr. 2, 1976

[30] Foreign Application Priority Data

Apr. 2, 1975 Japan .................................. 50-39949

[51] Int. Cl.² .............................................. H05K 3/30
[52] U.S. Cl. ..................................... 29/564.6; 29/741
[58] Field of Search .......... 29/203 B, 203 D, 203 DT, 29/203 DS, 626, 33 K, 33 M, 564.6, 739, 741

[56] References Cited

U.S. PATENT DOCUMENTS

| 3,597,824 | 8/1971 | Yoshida et al. | 29/203 B |
| 3,777,350 | 12/1973 | Maeda et al. | 29/203 B |
| 3,972,100 | 8/1976 | Zemek et al. | 29/203 B |

*Primary Examiner*—Carl E. Hall

*Attorney, Agent, or Firm*—Blum, Moscovitz, Friedman & Kaplan

[57] ABSTRACT

A machine for processing and securing parallel lead electronic circuit elements into lead receiving openings formed in a printed circuit board is provided. The machine includes a supply assembly for selectively supplying one group of a plurality of distinct groups of parallel lead electronic circuit elements, the supply assembly including a selecting sub-assembly for selecting one of the circuit elements from the selected group circuit elements to be supplied. A transfer assembly includes a chuck for receiving the supplied circuit elements and displacing same to a release position. An insert assembly is adapted to effect release of the circuit elements when the chuck is displaced to a release position and includes a holding sub-assembly for receiving each circuit element released by the chuck at the release position and a plunger sub-assembly adapted to engage the circuit elements at the release position and displace the circuit elements from the release position to an inserted position. A board handling assembly disposes the receiving openings in the printed board in alignment with the circuit elements so that the parallel leads each circuit element are received in the appropriate receiving openings when same are displaced to the inserted position.

22 Claims, 55 Drawing Figures

FIG-7    FIG-8
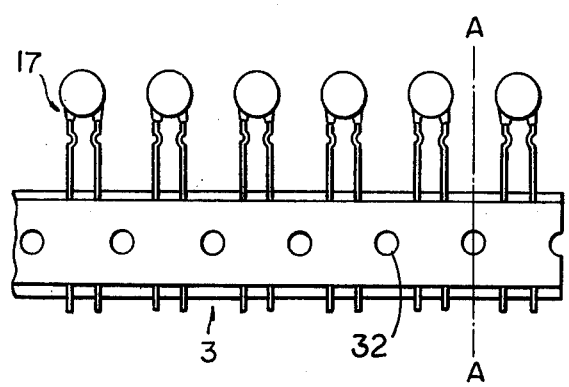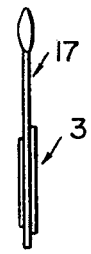
FIG-9    FIG-10    FIG-11
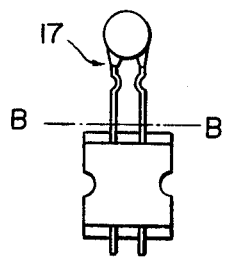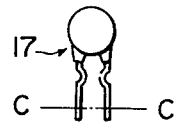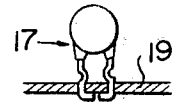

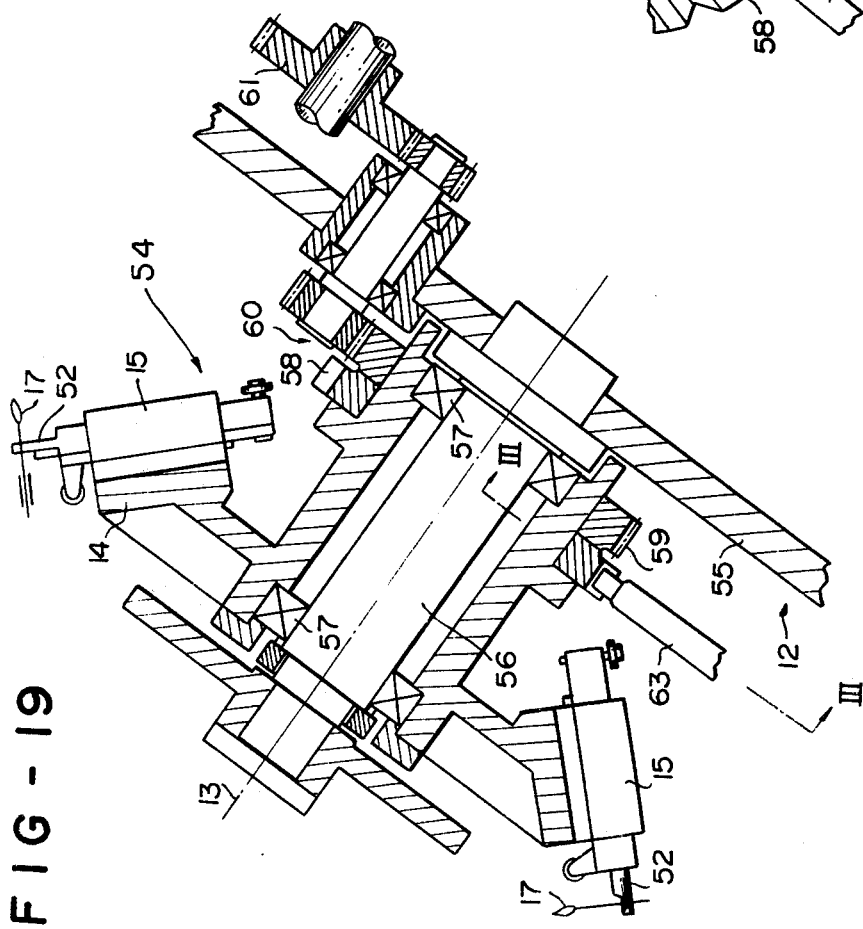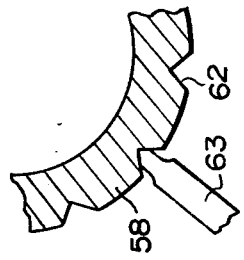

FIG-21  FIG-22
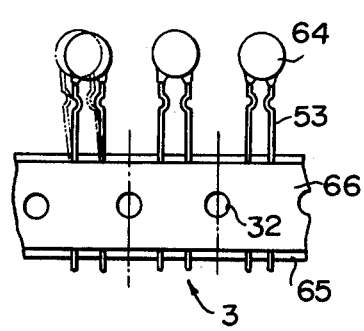
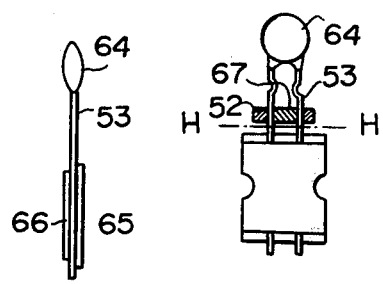
FIG-23
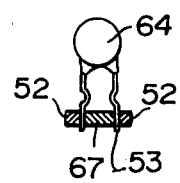
FIG-24

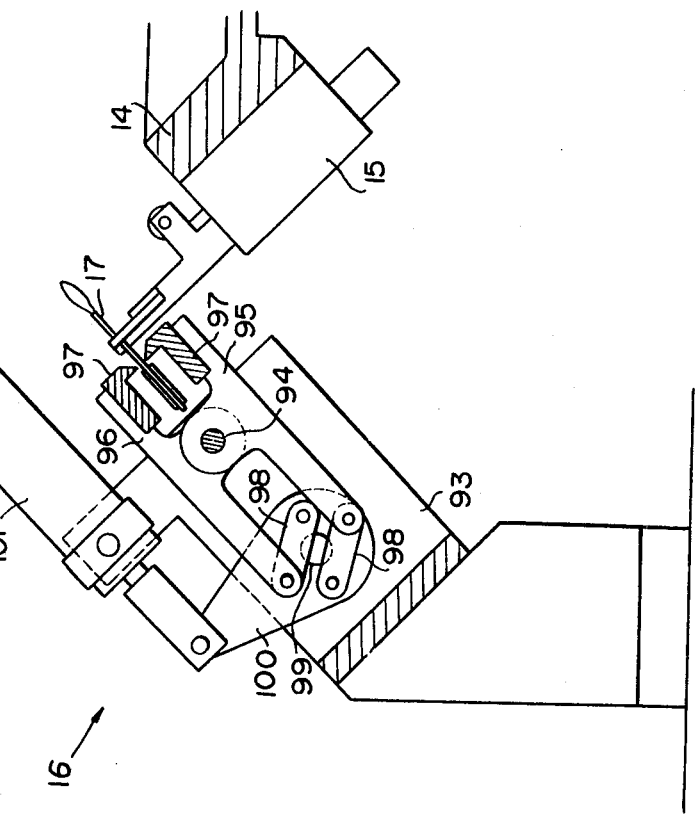
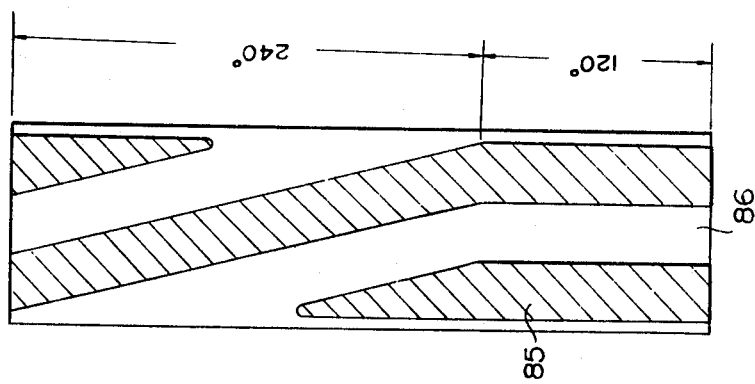

MACHINE FOR PROCESSING AND SECURING PARALLEL LEAD ELECTRONIC CIRCUIT ELEMENTS TO A PRINTED CIRCUIT BOARD

BACKGROUND OF THE INVENTION

This invention is directed to a machine for processing and securing parallel lead electronic circuit elements to a circuit substrate and in particular to automatically securing selected electronic circuit elements from a plurality of stored groups of electronic circuit elements to a printed circuit board.

Heretofore, machines specifically provided for applying parallel lead electronic circuit elements to printed circuit boards have been provided. One approach is to feed the printed circuit substrate section by section through a line of special purpose machines for individually applying each different type of electronic circuit elements to the circuit board. An alternative approach is the use of quasi-single use machine capable of mounting a single type or several different types of circuit elements in a particular order on the printed circuit board by moving the circuit board in first and second perpendicular coordinate directions each time an element is mounted to the circuit board. Nevertheless, such prior art machines require considerable expense in providing the extra equipment capable of handling the different types of electronic circuit elements, often cause considerable time loss when the type of circuit element processed by the machines is changed, and are less than reliable. Thus, such automated machinery for mounting parallel lead electronic circuit elements to printed circuit boards has not provided the same benefits which obtain to the automated application of coaxial type circuit elements to such printed circuit boards.

SUMMARY OF THE INVENTION

Generally speaking, in accordance with the invention, a machine for processing and inserting parallel lead circuit elements into lead receiving openings in a printed circuit board is provided. The machine includes a supply assembly for selectively supplying one group of a plurality of distinct groups of parallel lead circuit elements, the supply assembly including a circuit element selecting sub-assembly for selecting one of the circuit elements from the selected group of circuit elements to be supplied. A transfer assembly is provided for receiving each of the supplied circuit elements and for displacing same to a release position. The transfer assembly includes a chuck for gripping the supplied circuit element during receipt and displacement of the circuit element to a release position. An insert assembly includes a release mechanism operatively disposed to engage the chuck and effect release of the circuit element gripped thereby when the chuck is displaced to the release position. The insert assembly further includes a holding sub-assembly for receiving each circuit element released by the chuck at the release position, and a plunger sub-assembly for engaging the circuit element at the release position and displacing the circuit element from the release position to an inserted position. A printed circuit board handling assembly disposes the receiving openings in the printed board in alignment with the printed circuit elements so that parallel leads of the respective printed circuit elements are received in the receiving openings when the circuit elements are displaced to the inserted position.

Accordingly, it is an object of this invention to provide automated machinery for mounting parallel lead electronic circuit elements to printed circuit boards.

A further object of this invention is to provide improved automated machinery for automatically inserting parallel lead electronic circuit elements into receiving openings in printed circuit boards without utilizing a special support member for supporting supplied circuit elements until the circuit elements are to be inserted into the circuit board.

Still a further object of this invention is to provide a simplified and less expensive automated machinery for processing and securing parallel lead electronic circuit elements to printed circuit boards.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 7 is a plan view of a circuit element carrying tape constructed in accordance with the instant invention;

FIG. 8 is an elevational end view of the circuit element carrying tape illustrated in FIG. 7;

FIG. 9 is a plan view of a separated portion of the circuit element carrying tape illustrated in FIG. 7;

FIG. 10 is a plan view illustrating processed electronic circuit element about to be received by the insert sub-assembly depicted in FIG. 28;

FIG. 11 is a sectional view of an electronic circuit element secured to a printed circuit board by a machine assembly constructed in accordance with the instant invention;

FIG. 19 is a sectional view of a rotary chuck support constructed in accordance with a preferred embodiment of the instant invention;

FIG. 20 is a sectional view taken along line III—III of FIG. 19;

FIG. 21 is a plan view of the circuit element carrying tape illustrated in FIG. 7;

FIG. 22 is an elevational end view of the circuit element carrying tape depicted in FIG. 21;

FIG. 23 is a plan view of a portion of the circuit element carrying tape being gripped by a chuck, illustrated in section;

FIG. 24 is a plan view of an electronic circuit element being gripped by a chuck, illustrated in section, after removal of the tape therefrom;

FIG. 26A is a developed view of the barrel cam illustrated in FIG. 26;

FIG. 27 is an elevational view of a cutter sub-assembly constructed in accordance with a preferred embodiment of the instant invention;

DETAILED DESCRIPTION OF THE PREFERRED EMBODIMENTS

Figure 1:
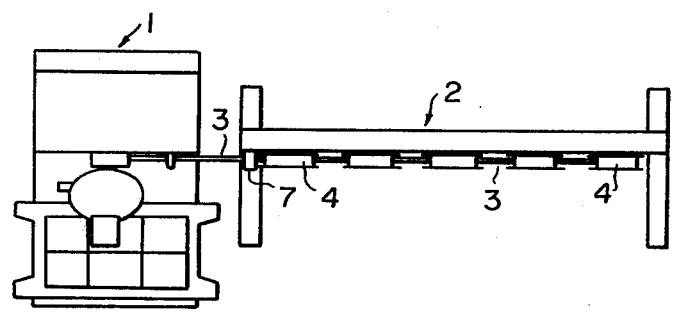
FIG. 1 is a plan view of an automatic machine assembly for processing and securing electronic circuit elements to a printed circuit board constructed in accordance with a preferred embodiment of the instant invention.
Figure 2:
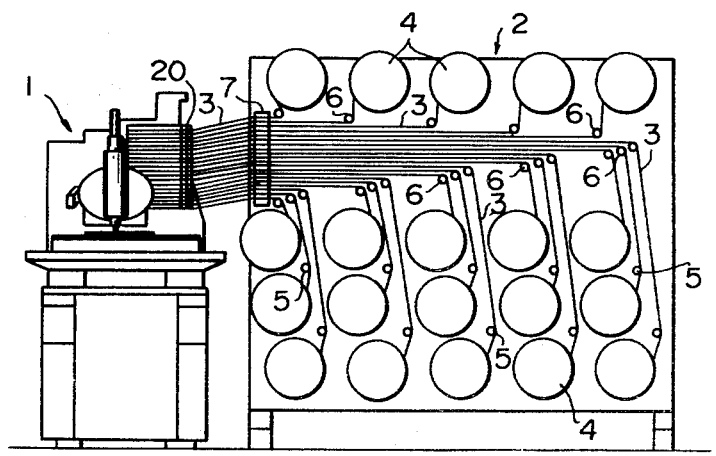
FIG. 2 is an elevational view of the machine assembly depicted in FIG. 1.

Reference is now made to FIGS. 1 and 2 wherein a reel support assembly, generally indicated as 2, and a machine 1 for automatically processing and inserting electronic circuit chip elements in a printed circuit board are depicted. As is explained in detail below, the machine components and reel supply assembly components are controlled by a conventional programmed NC panel (not shown), such panels being well-known in the art rendering discussion directed thereto unnecessary.

Reel support assembly 2 includes a plurality of tape carrying reels 4, each tape carrying reel having a tape 3 carrying a series of electronic circuit elements attached thereto. The tape reels are mounted in a conventional manner to the tape support assembly to permit the tape wound thereon to be guided around guide rollers 5 and feed rollers 6 to the machine 1.

Each of the tapes 3 includes a predetermined electronic circuit component such as a specific value capacitor, resistor etc. As is illustrated in FIG. 7, the circuit elements 17 are of the two-parallel lead variety and are secured to the tape 3, which tape includes apertures 32 therein. Accordingly, the tapes 3 having the respective circuit elements to be secured to a printed circuit board, also referred to as a printed circuit substrate, are wound upon the reels 4 and distributed into parallel relationship by the respective guide rollers 5 and feed rollers 6 whereafter the respective tapes are applied through a comb-like guide 7 to the machine 1.

Referring specifically to FIGS. 3 through 6, the machine 1 is substantially comprised of a supply assembly, generally indicated as 8, a transfer assembly, generally indicated as 9, an insert assembly generally indicated as 10, a table assembly, generally indicated as 11, and a frame 12 for supporting the respective supply, transfer, insert and table assemblies. The operation of the respective supply, transfer, insert and table assemblies is hereinafter explained with particular reference to FIGS. 3 through 11, whereafter, each of the respective assemblies will be described in detail.

Each of the respective circuit element carrying tapes 3 are supplied to the supply assembly 8. The particular tape that is supplied is selected by the NC program and applied to a cutter sub-assembly, generally indicated as 16, which sub-assembly effects cutting of the specific tape along a line A—A illustrated in FIG. 7 in order to separate each circuit element and portion of tape carrying same as illustrated in FIG. 9. After cutting of the tape portion and associated circuit element at the cutting sub-assembly, the parallel leads of the circuit element are gripped by one of a plurality of chucks 15 provided on the periphery of a rotary chuck holder 14 mounted at any angle of 45° with respect to the horizontal plane. During the transfer of the circuit element by the transfer assembly, the leads of the circuit element 17 are cut along line B—B, indicated in FIG. 9, into the form illustrated in FIG. 10, whereafter the circuit element is transferred in an upright state to be positioned at the insert assembly 10. At the insert assembly position, each circuit element 17 is clamped by the insert assembly and released by the chuck, whereafter the circuit element is urged into and through openings in the printed circuit board by the insert assembly. As is detailed below, the insert assembly can include a rotary head sub-assembly for turning the circuit element 90° about its vertical axis when required. The printed circuit board 18 to which each electronic circuit element 17 is to be secured is positioned on the table assembly 18, and the table assembly is coordinately displaced in the X and Y directions in a horizontal plane in accordance with programmed instructions from the NC program to thereby bring the lead receiving openings of the printed circuit substrate into alignment with the insert assembly. Once the parallel leads are inserted through the openings in the printed circuit board, the portions of the leads extending through the openings in the substrate 19 are bent at right-angles in the manner illustrated in FIG. 11, to thereby secure the circuit element 17 to the substrate 19.

Accordingly, the supply assembly 8, transfer assembly 9, insert assembly 10 and table assembly 11 are supported by the frame 12 and effect processing, inserting and securing of the respective circuit elements to a printed circuit board in the manner to hereinafter be discussed in greater detail with respect to the specific assemblies.

As illustrated in the preferred embodiment depicted in FIGS. 1 and 2, twenty tape reels are provided on the supply assembly 8, and the respective feed rollers 6 individually associated with each of the tape reels are selectively driven by the NC program. Each of the feed rollers 6 is a sprocket driven wheel with teeth for engaging the respective openings 32 disposed along the length of the tape 3 so that intermittent rotation of the roller effects a step by step feeding of the circuit elements secured to the tape 3. The guide 7 has a comb-like structure so that each of the individual element carrying tapes 3 is passed between the adjacent comb teeth. A further comb-like guide 20 is disposed on the machine 1 and belts formed of flexible material such as rubber, leather and synthetic resins are stretched between the individual teeth of the guides 7 and 20 so that the respective circuit element carrying tapes 3 slide over the belts with the friction between the belts and tapes substantially eliminated. The comb-like guide 20 is vertically displaceable to facilitate distribution of the tapes in a manner to be discussed more fully below.

The supply assembly 8 of the machine 1, as is more particularly illustrated in FIGS. 12 through 16, includes a shelf sub-assembly, generally indicated as 21, a column sub-assembly generally indicated as 22, a tape feeding sub-assembly generally indicated as 23, and a cutting sub-assembly generally indicated as 24. The shelf sub-assembly 21 is comprised of twenty elongated shelves 25 arranged one above the other, in stacked relationship, in order to support the respective circuit element carrying tapes 3 thereon. The shelf sub-assembly 21 is supported in a frame 26 (FIG. 4) in such manner that the shelves 25 can be lowered and raised with respect to frame 26 and so that each shelf 25 can be independently laterally displaced with respect to the lengthwise extent thereof.

The column sub-assembly 22 vertically raises and lowers the shelf sub-assembly 21 to bring a predetermined tape supporting shelf 25 into a proper elevation to be laterally displaced by kick-out cylinder 27. The tape feeding sub-assembly 23 effects intermittent feeding of the tape 3 carried by the laterally displaced shelf 25 through distinct increments in the lengthwise direction of the tape selected. The cutting sub-assembly 24 effects a severing of the end portion of the tape 3 as same is incrementally advanced to the cutting sub-assembly 24 to thereby separate each electronic circuit element 17 secured to the tape.

Figure 13:
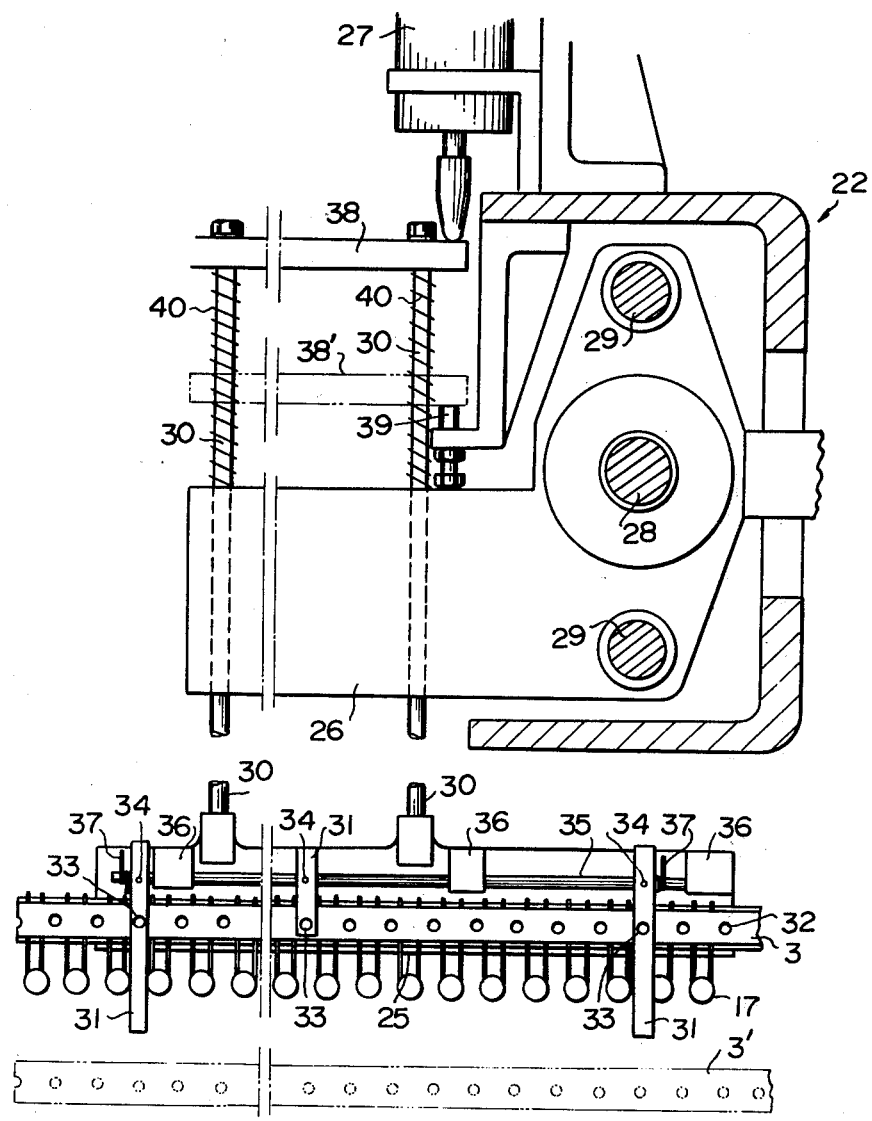
FIG. 13 is a plan view of the shelf sub-assembly depicted in FIG. 12 and a column sub-assembly constructed in accordance with a preferred embodiment of the instant invention.

The column sub-assembly 22 includes a vertically disposed threaded shaft 28 and guide rods 29, the threaded shaft being rotated at a predetermined rotational speed by a suitable drive source such as a pulse driving motor. The threaded shaft 28 and guide rods 29 are fitted in respective vertical female threaded bores and guide bores formed in the frame 26 of the shelf sub-assembly 21. Accordingly, the vertically arranged shelves 25 are provided on a first side of the frame 26, and each shelf 25 is supported by horizontal support rods 30 fitted for axial movement in respective horizontal bores formed in the frame 26. Each shelf 25 is elongated and includes a longitudinal channel or groove in which the circuit element carrying tape 3 is positioned. As illustrated in FIG. 13, each circuit element carrying tape 3 is set in the longitudinal channel formed in the shelf 25 by raising the tape positioning levers including fitted pilot pins 33 which pin extends therefrom into the openings 32 formed in the tape 3. Knock pins 34 couple the positioning levers 31 to an associated lever shaft 35, which shaft is supported by bearings 36 and is biased by a biasing spring 37 to maintain the levers 31 in a horizontal position.

Accordingly, when an NC program command provides a feed command for a specific circuit element carrying tape 3 to be delivered, the pulse motor is rotated to provide a given number of rotations of the threaded shaft 28 to raise and lower the frame 26 to thereby bring the shelf 25 supporting the circuit element carrying tape 3 to be selected into registry with the level at which the kick-out cylinder 27 is disposed. A photoelectric light sensor (not shown) is provided for detecting when the selected shelf 25 is disposed at the feed position and in response to detecting same energizes a cylinder which operates to push bar 38 to the position indicated at 38' in FIG. 13. By such movement, the selected shelf 25 is laterally projected by the associated support rods 30 thereby bringing the selected tape 3 to the displaced position indicated at 3'. A stopper 39 is disposed for limiting the displacement of the bars 38 and additionally, return springs 40 are provided for effecting return of the bar 38 once the kick-out cylinder 27 is returned to a rest position.

Figure 12:
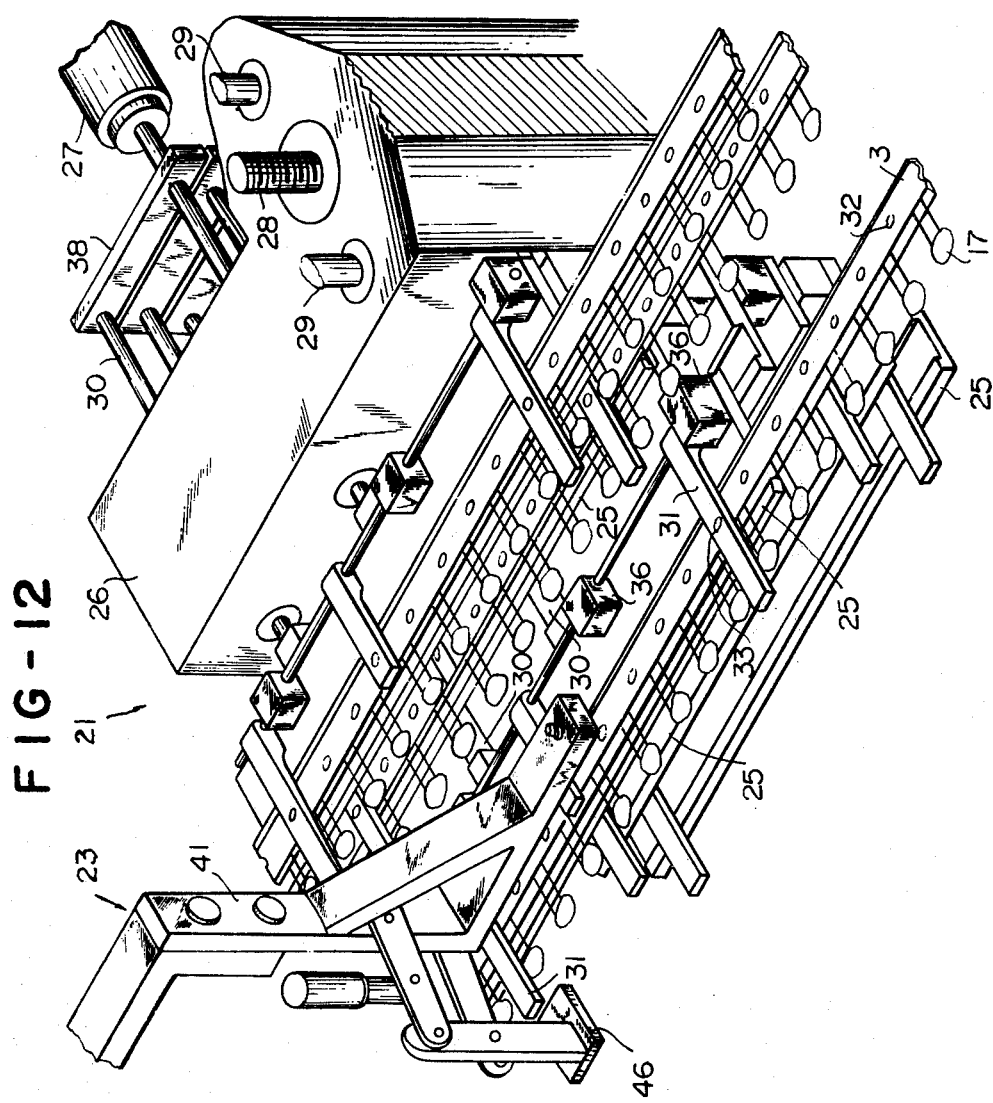
FIG. 12 is a perspective view of a shelf sub-assembly constructed in accordance with a preferred embodiment of the instant invention.
Figure 14:
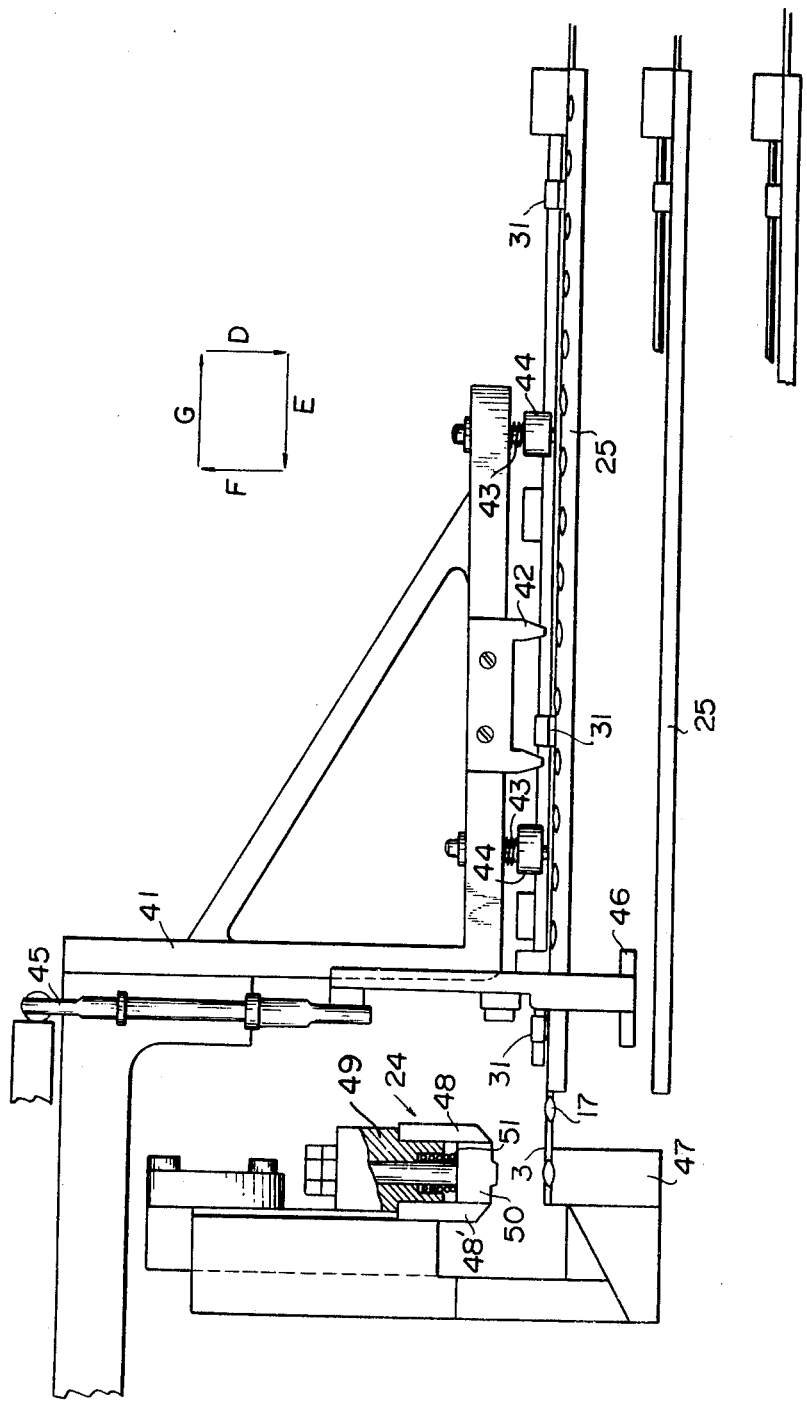
FIG. 14 is an elevational view of a tape feeding sub-assembly and cutting sub-assembly constructed in accordance with a preferred embodiment of the instant invention.

Referring specifically to FIGS. 12 and 14, the tape feeding sub-assembly 23 and cutting sub-assembly 24 are depicted. The tape feed assembly 23 includes a feed arm 41 displaceable about a rectangular path consisting of vertical and horizontal strokes illustrated by the arrows D, E, F and G in FIG. 14 along appropriate horizontal guides or like mechanisms. Feed arm 41 includes tapered pitch-correcting pins 42 and guidepins 44, which guidepins are biased by respective springs 43.

During each downward stroke of the feed arm 41 (indicated by the arrow D), the correcting pins 42 enter associated openings 32 in the circuit element carrying tape to correct the positioning thereof, whereafter, guidepins 44 are inserted into other openings 32 by being biased thereagainst. Simultaneous therewith, a release link 45, which release link is coupled to a hook 46 is raised, causing the positioning levers 31 to be raised by hook 46 and release hold of the tape 3. Thereafter, the next excursion of the feed arm 41 in a direction toward the cutting sub-assembly 49 (indicated by arrow E), causes the tape to be moved one increment and is brought to a halt. Accordingly, the leading end portion of the circuit element carrying tape 3 comes to rest at a predetermined position at the top of a cutter base 47 in the position indicated in FIG. 14.

Thereafter, cutter holder 49 is lowered by a drive mechanism (not shown), such as a hydraulic cylinder or the like, so that a tape holder 50 contacts and takes hold of the tape 3, and the cutter holder 40 continues to be lowered against the compression of spring 51. The tape 3 is severed by a cutter 48 as a result of the lowering of the cutter support 49 to thereby separate a portion of the tape carrying only one circuit element 17. An auxiliary cutter 48' is provided to insure that the portion of the tape is cut even if the cutter 48 does not effect a removal of the portion of the tape. Once the portion of the tape is severed, feed arm 41 commences its upward excursion (in the direction of the arrow F) while at the same time, hook 46 is lowered to thereby lower the positioning lever 31, to insert the guidepins 33 into the openings 32 in the tape 3 to thereby effect positioning and holding of the tape. Finally, the final horizontal excursion of the feed arm (in the direction indicated by the arrow G) effects a return of the feed arm to its initial starting position. Accordingly, the supply assembly selects the specific tape from the group of tapes carrying circuit elements, and thereafter effects a severing of a portion of the tape containing one circuit element from the group contained on the tape selected to be transferred by the transfer sub-assembly 9 during the next phase of operation of the machine 1. Thereafter, the aforedescribed operation of the assembly is repeated until the number of selected elements from a particular group represented by the tape selected is completed, whereafter, the hook 46 is raised to open the positioning levers 31 and cylinder 27 is rendered inoperative thereby causing the laterally displaced shelf 25 to be retracted to the initial position by the restoring force of the springs 40 to thereby render the supply sub-assembly ready for the next NC program command.

It is noted, that the supply assembly described herein renders it possible to automatically supply a large number of distinct electronic circuit component elements. Additionally, certain electronic circuit elements may be automatically and selectively supplied from a large number of differing circuit elements by appropriately programming the NC program. Moreover, in addition to the reliability of the supply assembly being improved, the amount of space required to provide different elements is limited, and only a single tape feed sub-assembly is required. Moreover, the efficiency obtained in supplying the different circuit elements provides for considerable cost savings during manufacture.

Reference is now made to FIGS. 6 and 15 through 20 wherein the transfer assembly 9 is illustrated in detail. As is specifically illustrated in FIG. 15, once the portion of the tape 3 supporting the electronic circuit element 17 is separated by the cutter 48, the portion of the tape is maintained in position by the tape holder 50. A chuck 15 disposed at a position proximate to the cutter base 47 is raised relative to the element 17 and grips the parallel leads 53 of the circuit element by means of a fixed claw 67 and movable claw 52. Once the gripping is effected by the chuck, the cutter support 49 is retracted to thereby releasably secure the hold of the circuit element by the holder 50. Thereafter, the transfer assembly 9 moves the chuck 15 with the element gripped thereby to the insert assembly 10 in a manner to be discussed more fully below.

The transfer assembly 9 includes a plurality of chucks 15, a rotary chuck support, generally indicated as 54, and a cutter sub-assembly 16 for cutting the extra lead portions and tape off each circuit element during the transfer operation. In FIGS. 19 and 20, a preferred example of the rotary chuck support 54 is illustrated. A rotary chuck holder 14 is supported on a shaft 56, which shaft is rotatably supported by bearings 57. The shaft is axially oriented at a right angle to an upper front portion of the frame 12 so that the axis 13 defines an angle of 45° with respect to the horizontal. The rotary chuck holder 14 includes a boss, to which is secured a timing member 15 and a spur gear 59. A pinion 60 transmits rotation from a gear 61 to gear 59 and accordingly to the rotary chuck holder 14. Gear 61 is adapted to intermittently rotate the rotary chuck holder at constant increments. For example, intermittent rotation of the rotary chuckholder can be effected by a pulse motor or a reciprocating cylinder via a ratchet lever.

In order to effect synchronization of the intermittent rotation of the rotary holder 14, the timing member 48 is provided with a plurality of peripherally disposed notches, the respective notches being adapted to receive a latch lever 63 adapted to be displaced into and out of contact therewith. The respective chucks 15 are provided at uniformly spaced distances around the periphery of the rotary chuck holder 14 and are positioned to circumscribe a one co-axial with the axis 13 of the shaft 56, the cone having an apex angle of 90°. An equal number of notches is provided for the number of chucks in order to insure that the incremental pitch of intermittent rotation corresponds to the number of chucks. For example, if twelve chucks are provided, twelve notches 62 are provided to effect a complete revolution of the rotary holder after twelve incremental rotations. Also, at the highest rotary position of the rotary chuck holder 14, the chuck 15 is vertically disposed, and at the lowest position of the rotary holder, the chuck 15 is horizontally disposed, the diametrically opposed chucks defining an angle of 90° with respect to each other.

Figure 16:
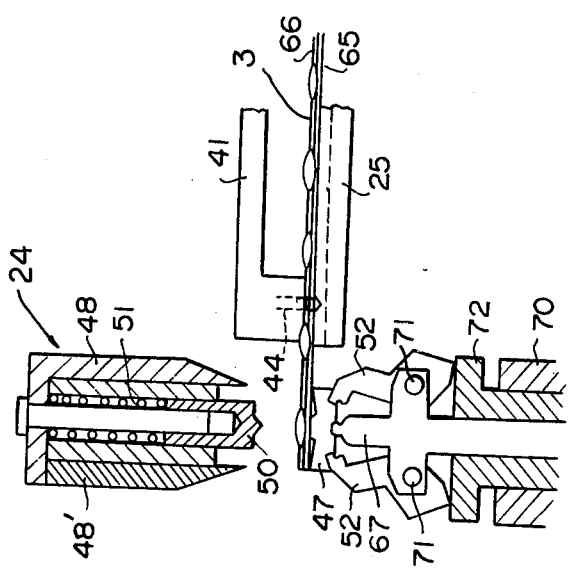
FIG. 16 is a partial sectional view of a cutting sub-assembly and chuck illustrated in FIG. 15.
Figure 15:
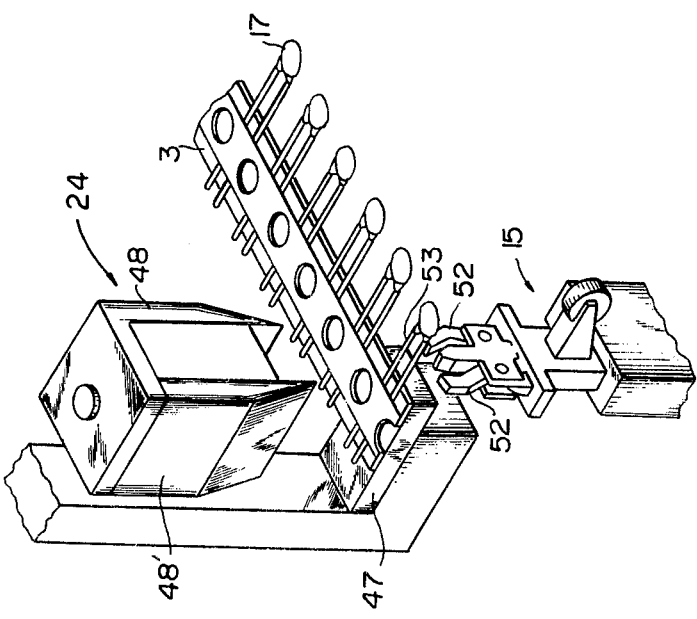
FIG. 15 is a partial perspective view of a cutting assembly and chuck constructed in accordance with a preferred embodiment of the instant invention.
Figure 17:
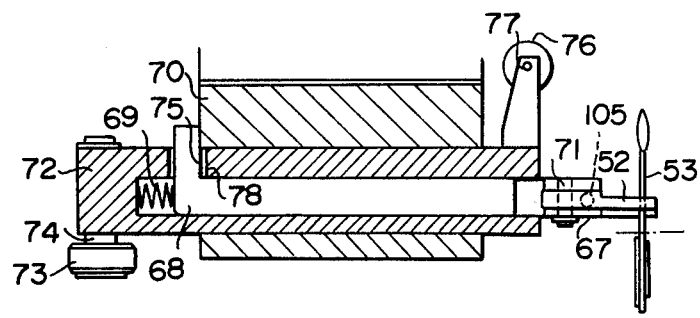
FIG. 17 is a sectional view in full elevation of a chuck constructed in accordance with a preferred embodiment of the instant invention.
Figure 18:
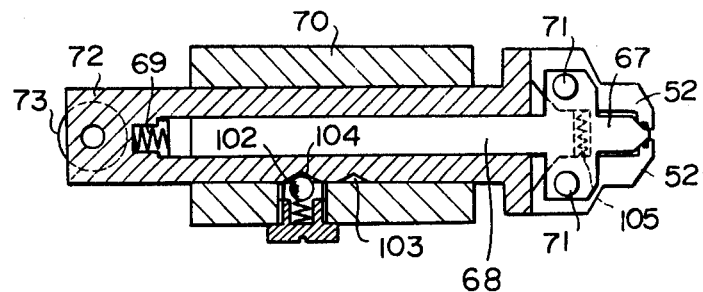
FIG. 18 is a full sectional view of the chuck depicted in FIG. 17.

Referring specifically to FIGS. 16, 17 and 18, chuck 15 includes movable claws 52 and fixed claw 67. Fixed claw 67 is integrally formed with block 68, block 68 being adapted to be urged against a fixed block 70 by a biasing spring 69. Movable claws 52 are mounted to movable block 68 by pivot pins 71 to permit the fixed claws to be pivotable thereabout. The movable claws are brought into engagement by the displacement of a second block 72 in a direction toward the respective movable claws 52. A roller 73 is rotatably mounted by a pin 74 to block 72 and is adapted to receive forces for moving the block 72 in the direction toward the movable claws when gripping of the parallel leads of the circuit to be transferred by chuck 15 is to occur. Block 72 is further adapted to be moved in the direction toward the movable claws even after the end wall 75 of block 68 strikes fixed block 70 and continues to be moved in such direction until locked by means of a spring biased ball 102 disposed in a recess 104 formed therein. Accordingly, the recess 104 is so positioned as to insure that the movable claws 52 firmly grip the leads 53 to maintain the leads securely gripped thereby. A roller 76 is rotatably mounted by a pin 77 on an integrally projecting portion of the block 72. When roller 76 is moved in a direction away from the fixed claws, as is best illustrated in FIG. 17, the block 72 is thereby moved in the same direction, causing the movable claws 52 to be pivoted away from each other about pins 71 by biasing spring 105 thereby releasing their grip on the parallel circuit element leads. Once the block 72 is sufficiently displaced away from the movable claws to effect a sufficient opening of the claws to thereby prevent gripping of the leads thereby, the end wall 78 of block 72 strikes an end wall 75 of block 68 and thereby carries block 68 in the same direction therewith. The block 72 includes a recess 103 therein which can be engaged by a ball 102 to thereby maintain the block 72 in the release position.

Reference is now made to FIGS. 15, 16 and 21 through 24 wherein the operation of the cutting assembly and chuck 15 are illustrated. Specifically, the element supporting tape 3 includes a base strip 65 and an adhesive tape 66 bonded to the base strip in such manner as to sandwich therebetween the parallel leads 53 of a specific type of electronic circuit element such as a capacitor, illustrated by circular head 64.

A series of electronic circuit elements are uniformly spaced along the lengthwise extent of the tape with the openings 32, as noted above, being disposed midway between the adjacent electronic circuit elements to insure reliability during processing of the tape. It is noted that the respective openings 32 can be provided between the respective parallel leads in order to facilitate processing of the tape.

Referring particularly to FIG. 16, the element carrying tape 3 is supported by and guided along a channel in shelf 25 by the tape feeding sub-assembly 23 so that the circuit element to be secured to the printed circuit board is brought into registry with the cutter base 47. Thereafter, the cutter sub-assembly is displaced into contact with the tape 3, thereby placing the tape holder 50 in contact with the circuit element and tape portion and further permitting the cutters 48 and 48' to sever the portion of the base strip 65 and adhesive tape 66 thereby leaving a single circuit element secured in the portion of the tape being held between the tape holder 50 and cutter base 47. Coincident with the severance of the tape portion, a command signal effects operation of cylinder 88 and crank 87, illustrated in FIG. 6, to thereby effect engagement of roller 73 aligned in position with the cutter assembly 24 and parallel leads of the circuit element to thereby cause the fixed claw 67 and movable claws 52 into the same elevation as the parallel leads of the circuit element. Accordingly, fixed claw 67 is disposed between the opposite leads of the electronic circuit element whereafter the movable claws 52 are brought together in the manner described above with respect to FIGS. 17 and 18, to thereby grip the respective leads. As is illustrated in FIG. 23, at this point, the portion of the tape remains on the extended portion of the leads with the movable claw 52 and fixed claws 67 of the chuck 15 firmly gripping the circuit element to be transferred. Upon gripping of the circuit element leads by the chuck 15, the cutter support is vertically displaced away from the cutter base 47 to thereby release hold of the tape 3 by the tape holder 50. Thereafter, the circuit element is displaced to a new position by the chuck gripping same and the base strip 65 and adhesive tape 66 are removed by a cutting of the leads along the line H—H in FIG. 23 in a manner to be discussed more fully below, thereby leaving the circuit element depicted in FIG. 24 to be transferred to the insert position.

It is noted that the use of the circuit element carrying tape construction illustrated in FIG. 21, wherein a series of electronic circuit elements are disposed at uniformly spaced increments along the lengthwise extent of the tape, in combination with the uniformly spaced openings in the tape, permits increment by increment feeding of each circuit element so that the circuit element can be reliably separated from the remaining circuit elements secured to the tape. Moreover, the tape permits the particular element to be transferred to be specifically clamped by the tape holder at a proper position, so that a portion of the tape carrying the specific circuit element can be removed, and then the separated element can be removed from the base strip and adhesive tape by a cutting of the leads between the chuck and base strip. In this manner, a highly precise and reliable assembly for continuously processing electronic circuit elements is provided. Moreover, although circuit elements often can become misaligned when same are secured to the tape 3 as illustrated in FIG. 21, by utilizing the clamping features of the chuck 15, and securing the leads proximate the tape, problems of misalignment are clearly avoided. Moreover, no take-up reel or other take-up mechanism is required since the portions of the tape are severed and only a simple waste container for collecting the cut-off ends is needed.

Figure 25:
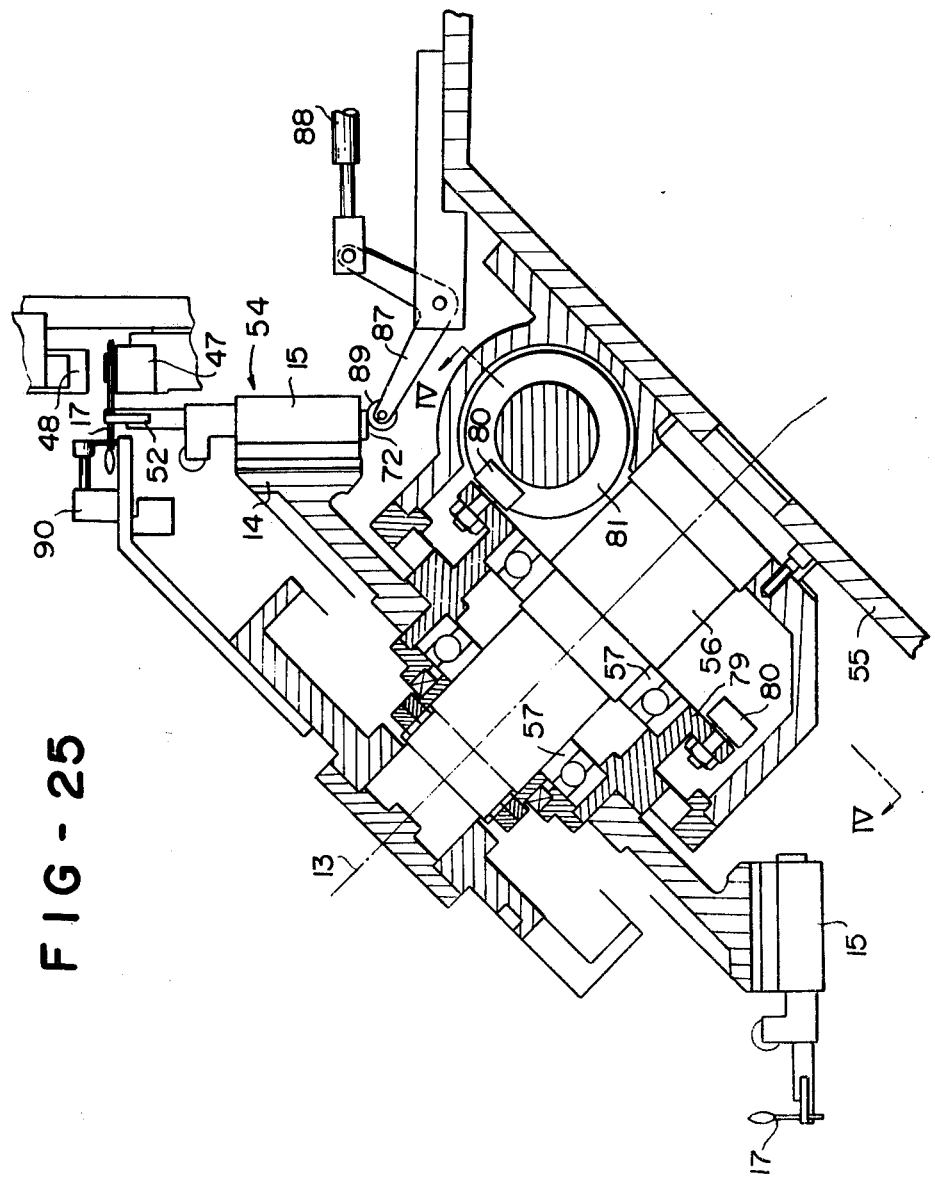
FIG. 25 is a sectional view of a rotary chuck support constructed in accordance with an alternate embodiment of the instant invention.
Figure 26:
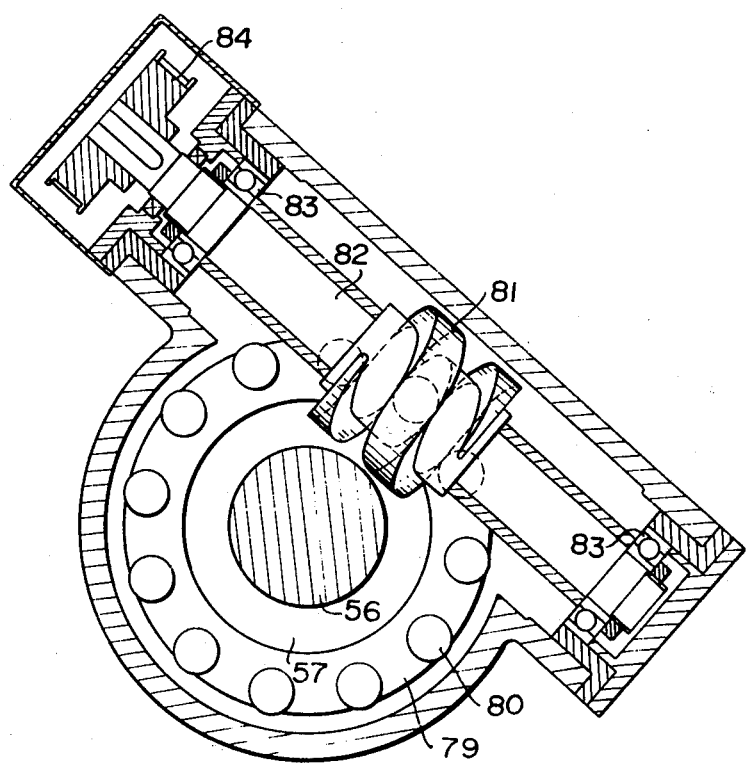
FIG. 26 is a sectional view taken along line IV—IV of FIG. 25.

Reference is now made to FIGS. 25, 26 and 26A wherein a further embodiment of the rotary sub-assembly 54 is depicted, like reference numerals being utilized to describe like elements illustrated and described above. The rotary chuck support 14 is secured to shaft 56 and is rotatable about the axis 13 of the shaft, which axis extends at an angle of 45° with respect to the horizontal. A disc 79 is secured to the shaft 56 and support rollers 80 which rollers are peripherally disposed thereabout (the rollers 80 being evenly spaced about the periphery and corresponding in number to the number of chucks 15. As is illustrated in detail in FIG. 26, a barrel cam 81 respectively engages the drive rollers 80 to effect an intermittent rotation of the rotary chuck holder 14.

Figure 6:
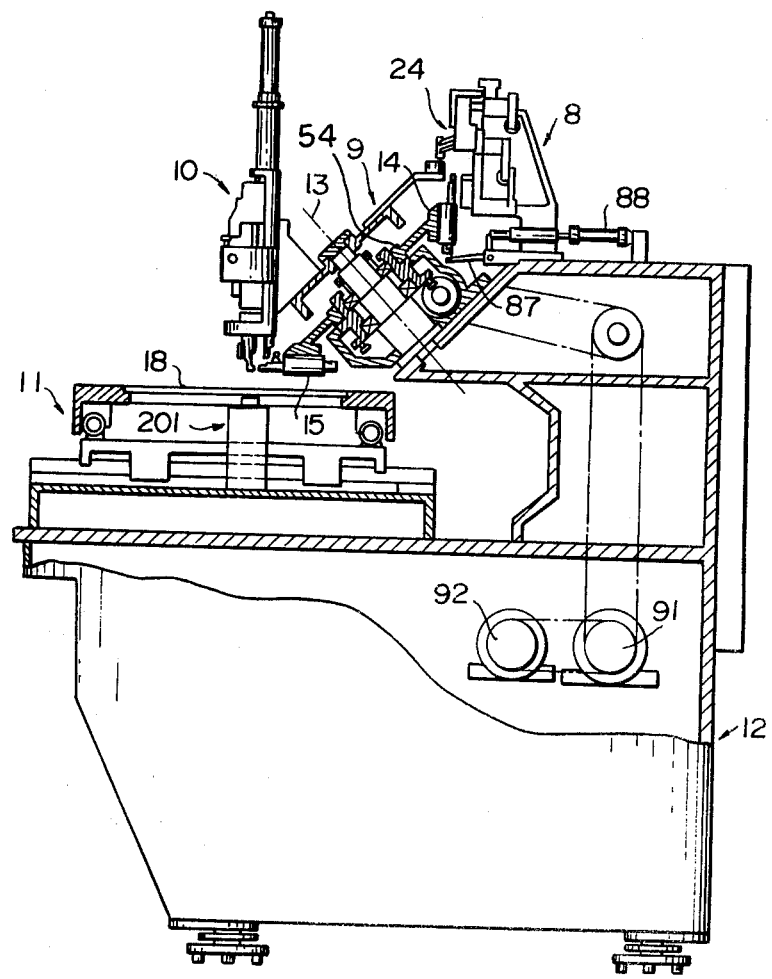
FIG. 6 is a sectional view taken along line II—II of FIG. 3.

In FIG. 26A, a developed view of the intermittent barrel cam 81 illustrates the manner in which the ridge portions 85 and groove portions 86 are alternately arranged to effect intermittent rotation of the rotary chuck holder 14. The ridge portions 85 and groove portions 86 define an incline screw-like camming surface over a radial angle of 240° of barrel cam 81, the remaining 120° of the barrel cam surface having ridge portions and groove portions that are parallel to a plane normal to the cam axis. The ridge portions 85, groove portions 86 and rollers 80 operating in cooperating relationship therewith are highly toleranced in diameter and pitch to thereby limit any backlash during operation. Accordingly, by driving the cam shaft 82 at a constant speed, the disc 79 and hence the rotary chuck holder 14 are intermittently rotated through precise increments during engagement of the rollers 80 by the inclined ridge portions 85 of the bearing surface and ceases to be rotated in response to engagement by the parallel portions of the ridges 85. The cam shaft 82 is rotated at a constant speed during the steps of selecting the tape carrying shelf 25 or in the case of coordinate displacements of the printed circuit board supporting table, and the rotation thereof may be interrupted by utilizing a one-way clutch, illustrated as 91 in FIG. 6, provided between the pulley 84 and drive motor, illustrated as 92 in FIG. 6, to effect synchronization of the rotation of the cam shaft with the timing cycle of the machine.

A bell crank 87 is driven by a cylinder 88 and effects a displacement of the block 72 of the chuck 15 by having roller 89 carried by the belt crank 87 engage same to thereby effect a clamping action by the chuck 15. An electronic photodetecting switch 90 is adapted to detect the arrival of the electronic circuit element 17 in registry with the cutter assembly 24 to thereby provide a signal to the NC program controller and synchronize displacement of the cylinder to effect clamping of the circuit element 17 by the claw 15.

Figure 3:
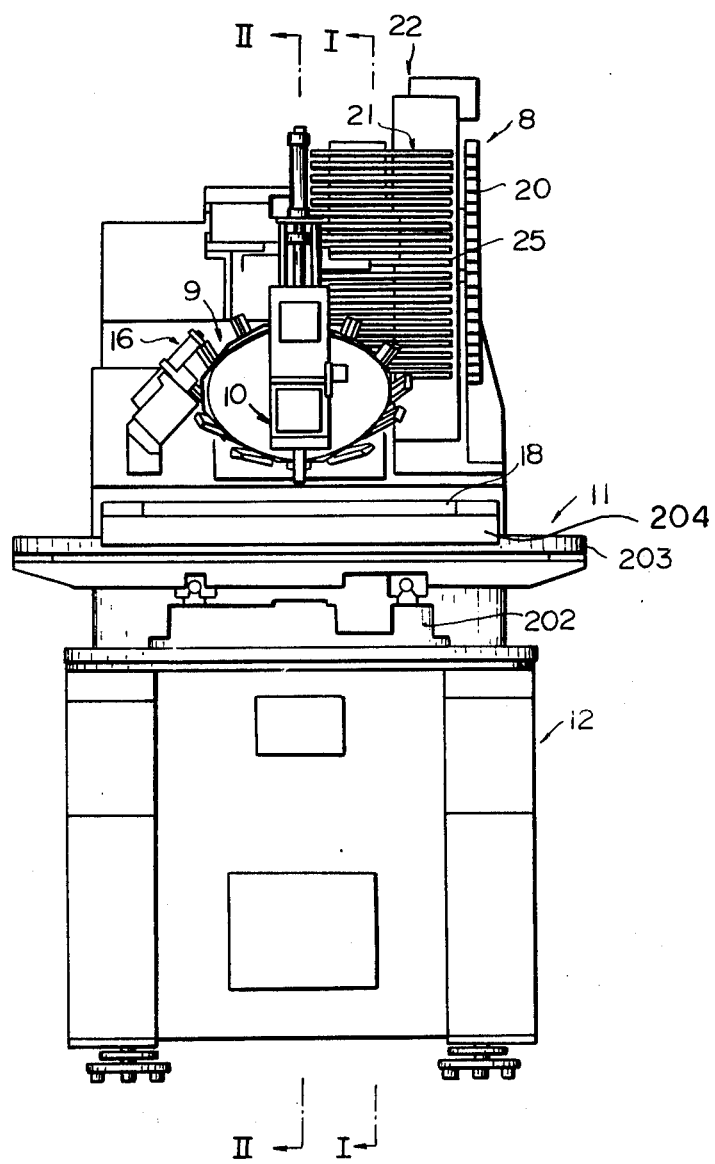
FIG. 3 is an elevational view of the machine assembly depicted in FIG. 1.
Figure 4:
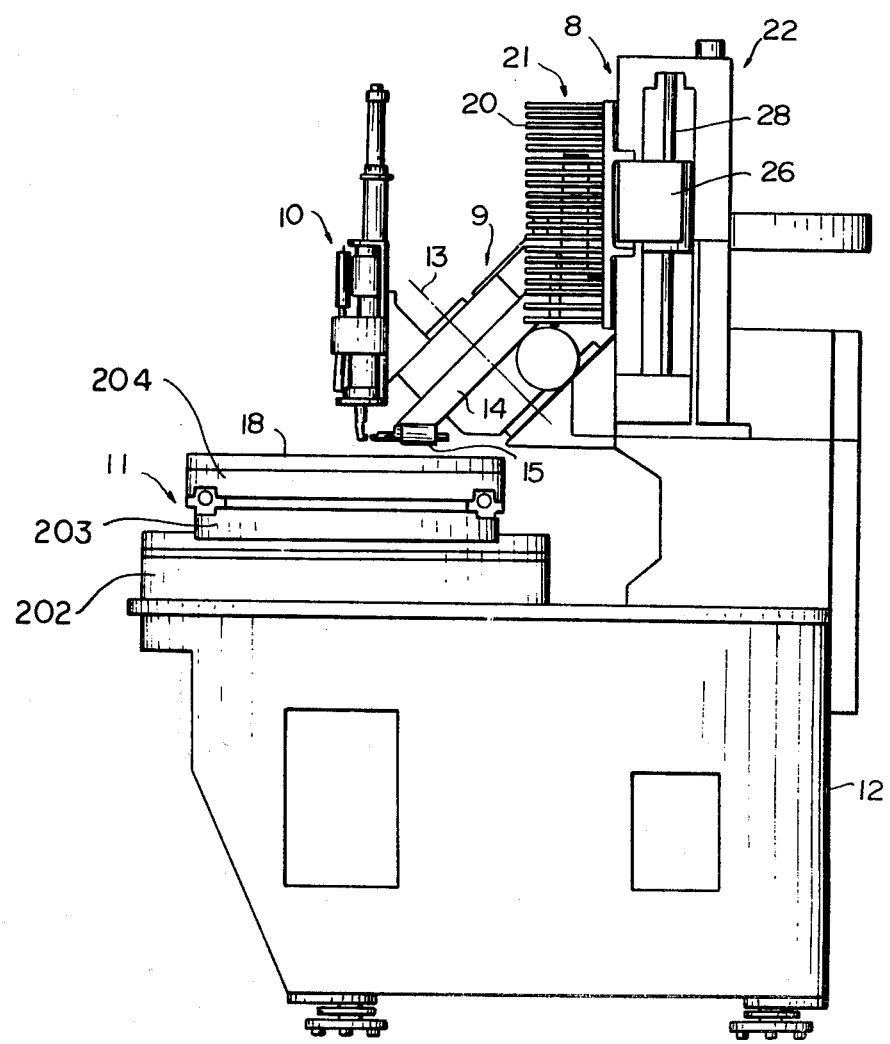
FIG. 4 is a side elevational view of the machine assembly depicted in FIG. 3.
Figure 5:
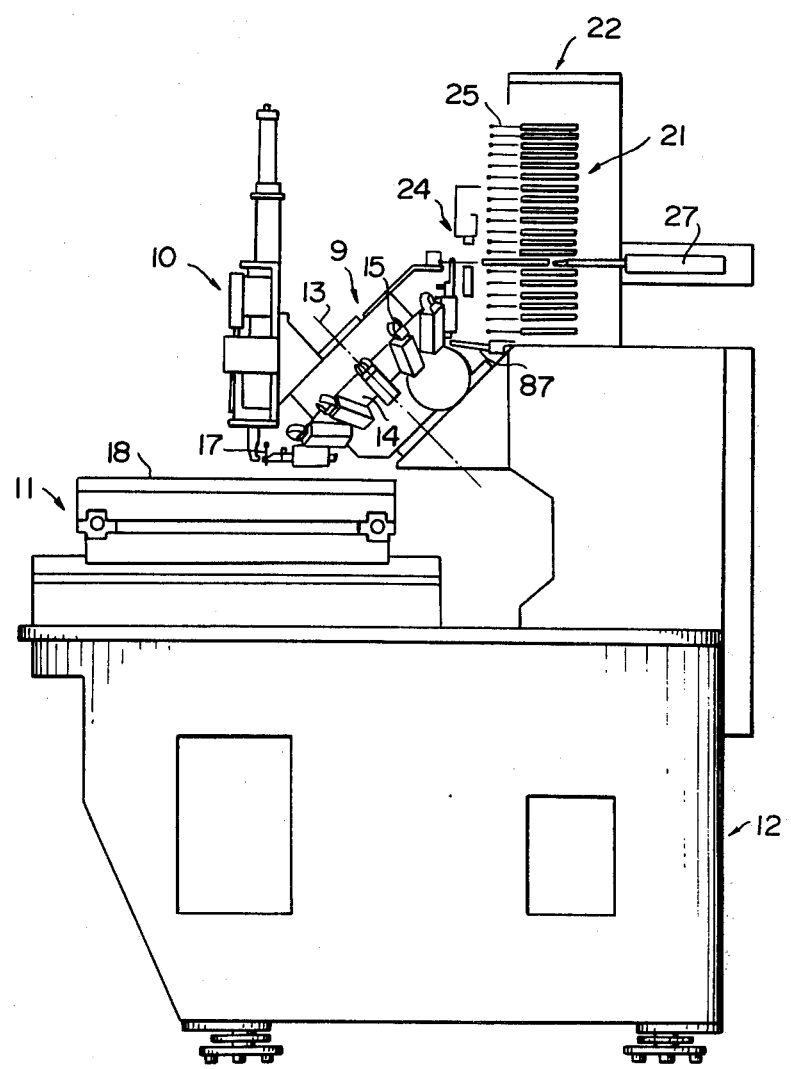
FIG. 5 is a sectional view taken along line I—I of FIG. 3.

As noted above, the transfer assembly 9 includes a cutter sub-assembly 16 depicted in FIG. 27 for severing the tape portion and portion of the parallel leads secured by the tape portion along the line H—H illustrated in FIG. 23, when the clamped circuit element is transferred from the horizontal position wherein same is gripped by the chuck 15 to the vertical insert position. The cutter sub-assembly 16 is positioned with respect to the rotary chuck support 54, as is best illustrated in FIG. 3, so that the circuit element 17 including the portion of the tape secured thereto is disposed between cutting blades 97. To this end, levers 95 and 96 are pivotally mounted by a pin 94 on a bracket 93 and support the respective blades 97 in facing relationship. Links 98 couple the respective levers 95 and 96 to a lever 100, which lever is rotatably secured about a pivot pin 99 to be pivotally driven by a drive cylinder 101. Accordingly, a pivotable driving of the lever 100 effects displacement of the links 98 and levers 95 and 96 to effect opening and closing of the cutting blades 97 to thereby effect a cutting of the leads along the line H—H illustrated in FIG. 23, whereafter, the circuit element gripped by the chuck takes on the form illustrated in FIG. 24 and is transferred to the insert assembly in a manner to be described more fully below.

Figure 28:
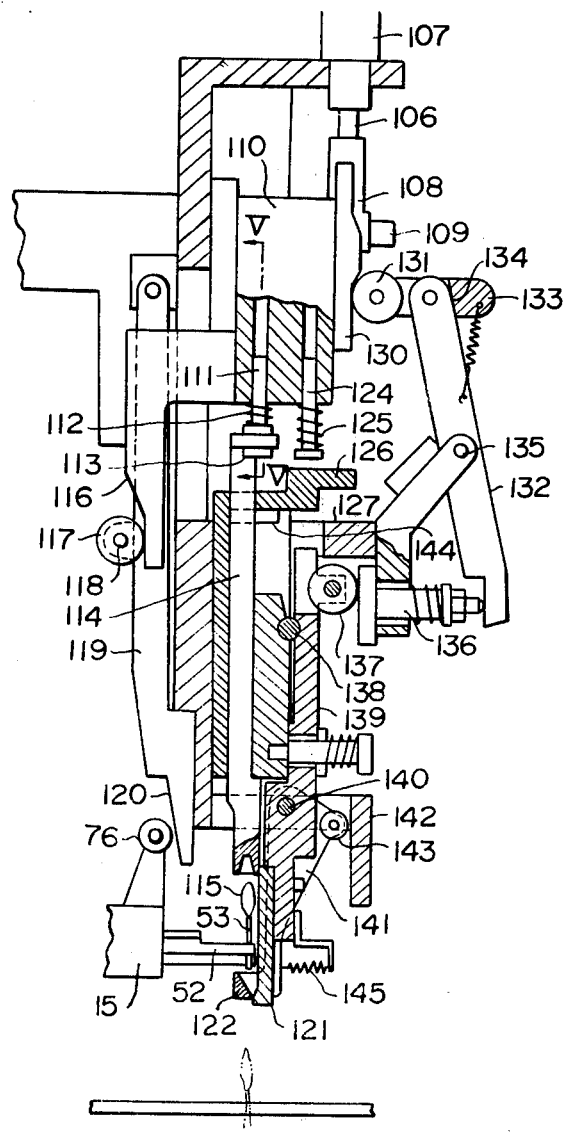
FIG. 28 is a sectional view of an insert sub-assembly constructed in accordance with a preferred embodiment of the instant invention.
Figure 29:
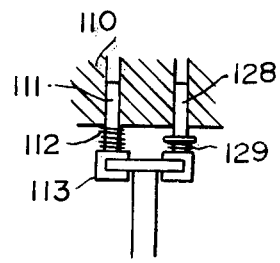
FIG. 29 is a sectional view taken along line V—V of FIG. 28.
Figure 30:
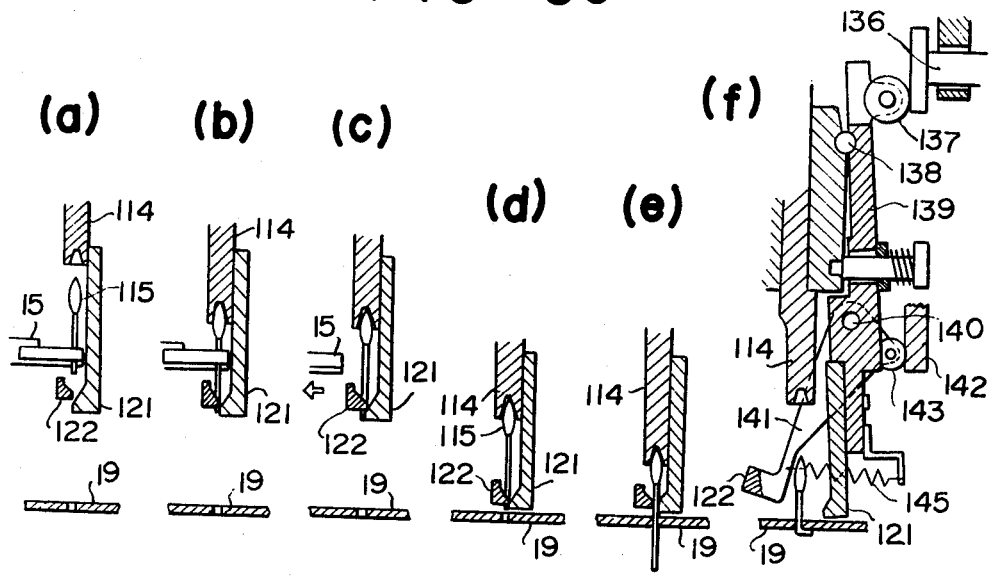
FIGS. 30(a) through 30(f) respectively depict the sequence of the circuit elements being inserted into the openings in the printed circuit board in accordance with the instant invention.

Referring particularly to FIGS. 28 through 31, the insert assembly for inserting the circuit elements in the printed circuit board is depicted. By way of reference, FIG. 28 illustrates a circuit element such as a capacitor 115, after the chuck has been displaced to the insert position, but prior to release of the circuit element 115 by the chuck. A movable block 110 includes a bolt 109 having secured thereto a rod end 108. Rod end 108 is coupled through a rod 106 to a cylinder 107, which cylinder in response to a command signal from the NC program effects a downward displacement of the movable block 110. Secured to the movable block 110 is a cam 116 and a pin 111. The pin 111 is lowered by a compression spring 112 as the block is displaced downward thereby applying a weak downward spring force against a push bar 114 coupled to the pin 111 by a bracket 113. When the head of the capacitor 115 is disposed in the recess 114' of the push bar 114 and is completely covered thereby, the state illustrated in FIG. 30 (b) is obtained. As the movable block 110 is being displaced downward, a roller 117 pivotably supported on a pin 118 secured to a lever 119 is cammingly engaged by camming surface 116 to thereby effect a pivoting of the lever 120 away from the capacitor 115 and into contact with the roller 76 of chuck 15 to thereby effect a releasing of the capacitor element 15 from the grip of the chuck 15, as is particularly depicted in FIG. 30(c). At this point, the capacitor element is prevented from turning by the recess 114° in the push bar 114, the engagement of the push bar 114, with the head of the capacitor effecting a downward displacement of the capacitor leads between lead guide 121 and lead holder 122, as is more particularly illustrated in FIG. 31.

Figure 32:
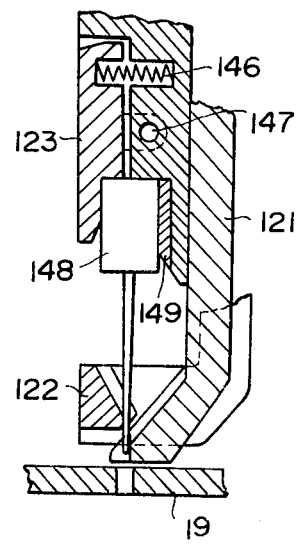
FIG. 32 is a clamping mechanism constructed in accordance with an alternate embodiment of the instant invention.

In an alternate embodiment, the push bar can be provided with a spring-biased chuck 123 as is more particularly illustrated in FIG. 32, the spring-biased chuck being particular suited for lightly gripping irregular type circuit elements or circuit elements having unusually shaped leads.

Once the capacitor 115 is transferred to the insert position depicted in FIG. 30(c) and is released by the chuck 15, the capacitor is lowered into a position proximate to the openings in the printed circuit board. The second stage of lowering the circuit element to the position indicated in FIG. 30(d) is effected by pin 124 secured to movable block 110, which pin under control of the spring 125 is displaced into 126 to effect displacement of same until halted by stopper 127. Thereafter, movable block 110 is further lowered, whereby a further pin 128, more particularly illustrated in FIG. 29, further displaces the push bar 114 in a downward direction, the displacement of the push bar 114 in a downward direction being effected by a spring 129 having a weaker biasing force than the spring 112 to thereby urge the leads of the capacitor through the openings in the substrate, the leads being guided by the lead guide 121 and lead holder 122 to obtain the inserted state depicted in FIG. 30(e) of the drawings. Thereafter the tip portion of the leads extending through the holes of the printed circuit substrate are cut off, if necessary, and then bent or clamped by suitable means, hereinafter described. Once bending is completed, the cylinder 107 effects displacement of the movable block in the upward direction away from the printed circuit board. The block 110 includes a cam 130 formed thereon for displacing a roller 131 to thereby displace a lever 132 in such manner as to be pivoted about a pin 135 and thereby effect movement of slidable pin 136 into contact with a roller 137. The consequence thereof is that the roller 137 effects a counter-clockwise rotation of lever 139 about pin 138 resulting in the lead guide 121 formed on the end of lever 139 being moved away from the circuit element. A roller 143 carried on a lever 141, which lever is rotatably mounted by pin 140 in response to the counter-clockwise pivoting of the lever 139 is engaged against a fixed element 142 to thereby effect a clockwise rotation of the lever 141, thereby effecting a further rotation of the lead holder 122 in a clockwise direction. In such manner, the lead guide 121 and lead holder 122 are retracted from the leads to define an open position as is more particularly illustrated in FIG. 30(f) so that the entire insert assembly can be retracted in the upward direction until same reaches the initial position, the insert assembly completely clearing the electronic capacitor during its upward stroke. Accordingly, upon completion of the aforedescribed insert sequence, a signal for feeding the next electronic circuit element to the insert position, and a signal for moving the table in the coordinate X and Y directions are produced by the NC program to thereby repeat the next insertion cycle. It is noted that the lead guide 121 and lead holder 122 are not opened during a downward displacement of the movable block 110 since the lever 133 is rotated with respect to the lever 132 so that the pin 136 is not displaced by the lever 132 thereby permitting cam 130 to be positioned beneath the roller 131 to effect the aforedescribed unclamping operation during the next upward stroke thereof.

Figure 31:
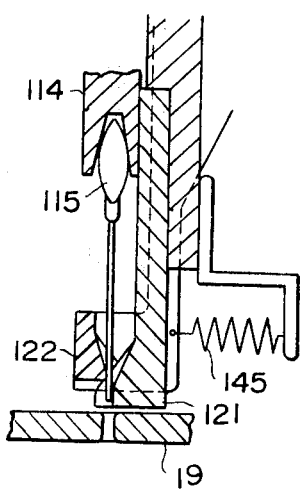
FIG. 31 is a sectional view of a clamping mechanism of the insert sub-assembly constructed in accordance with a preferred embodiment of the instant invention.

Reference is particularly made to FIG. 31, wherein an insert head for use in the insert assembly, and is particularly suited for use with a capacitor is depicted. The push bar 114 functions to prevent twisting of the capacitor element by being provided with a V-shaped recessed 114', the shape of the recess further effecting an urging of the element through the openings in the printed circuit board 19. Lead guide 121 includes tapered grooves in the tip portion thereof for receiving the parallel leads 153 and guiding same accordingly, and lead holder 122 additionally includes grooves for providing the leads in proper registry with the grooves in the lead guide 121. Furthermore, the lead guide 121 is biased by a biasing spring 145 to lightly urge the leads within the grooves.

Figure 33:
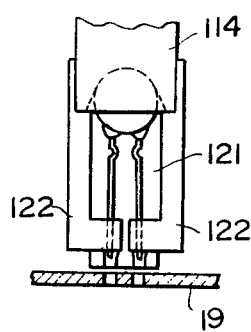
FIG. 33 is an elevational view of the clamping mechanism depicted in FIG. 32.
Figure 34:
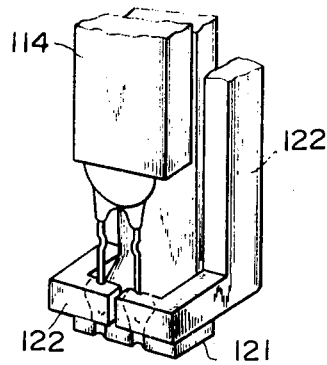
FIG. 34 is a perspective view of the clamping mechanism depicted in FIG. 32.

Referring now to FIG. 32, an alternate push bar arrangement for lightly clamping the head of the electronic circuit element when same is irregular is provided. The head 148 of the electronic circuit element is lightly clamped by chuck 123, which chuck is pivotally mounted by a pin 147 to the push bar 114 and is maintained in a clamped position by a biasing spring 146. If necessary, the element can be clamped between the chuck 123 and a auxiliary pad formed of rubber or other like resilient materials. The lead holder 122 is so adapted to independently align the leads as same are inserted into the openings in the circuit board, the relationship between the lead guide 121 and lead holder 122 being particularly illustrated in FIGS. 33 and 34.

Accordingly, the insert assembly is characterized by the use of lead guides having grooves extending in the direction of insertion of the leads for guiding the leads into the openings in a circuit board to thereby facilitate the insertion of parallel leads into the printed circuit board with guaranteed precision and without the need for any particular special purpose engaging member. Moreover, the number of electronic circuit elements and the different types of electronic circuit elements capable of being inserted by this mechanism is clearly increased by providing appropriate head adaptors for the particular shaped heads of the circuit elements to be inserted.

Reference is now made to FIGS. 35 through 39 wherein an insert assembly 10 constructed in accordance with an alternate embodiment and wherein the circuit elements can be rotated 90° about the vertical axis at the position at which the leads are to be inserted into the printed circuit board, is illustrated. It is understood that if a 90° rotation is required, the NC program would provide the necessary command signals to effect such an operation.

Figure 35:
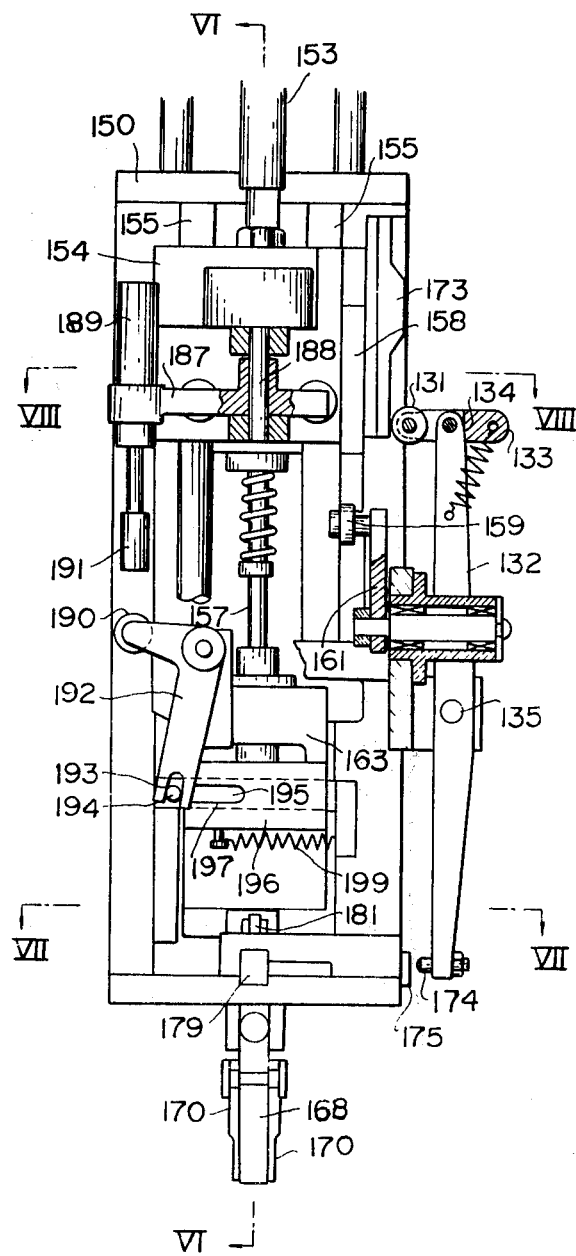
FIG. 35 is an elevational partially sectional view on an insert sub-assembly constructed in accordance with an alternate embodiment of the instant invention.
Figure 36:
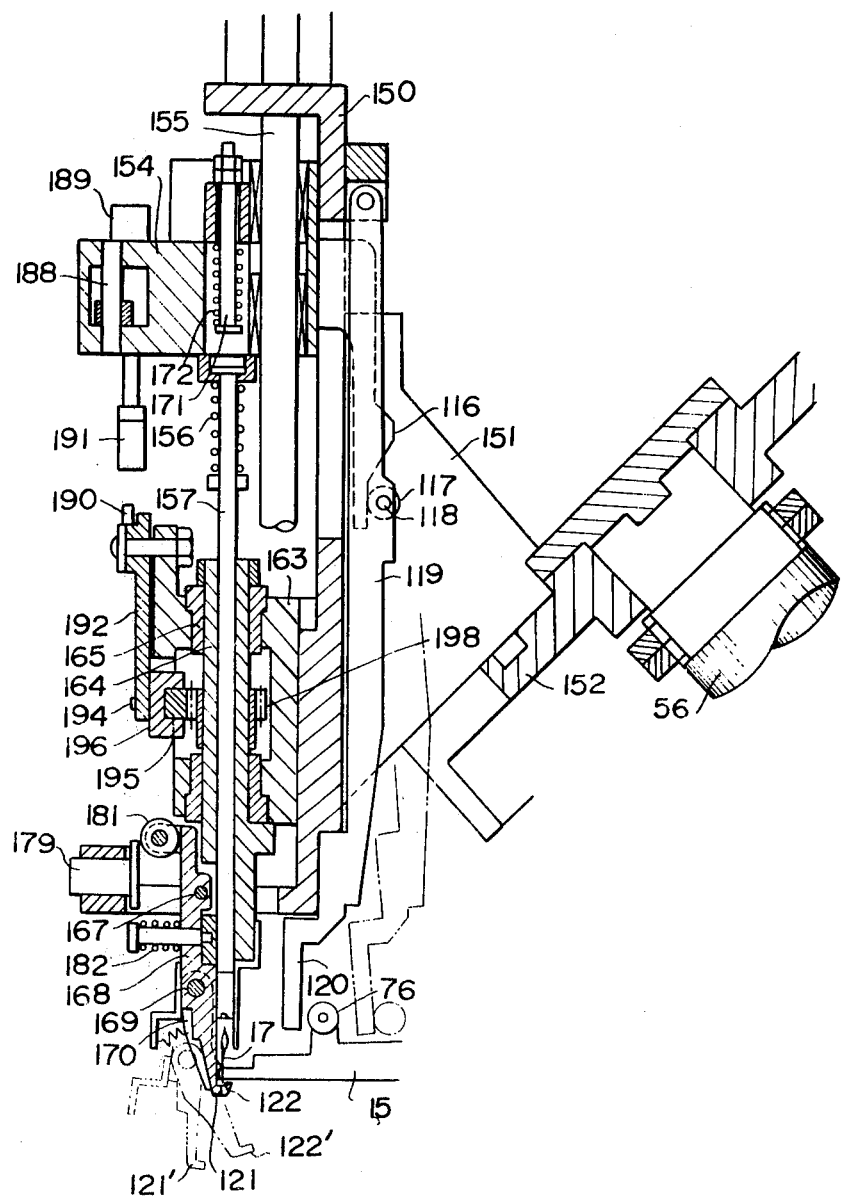
FIG. 36 is a sectional view taken along line VI—VI of FIG. 35.
Figure 37:
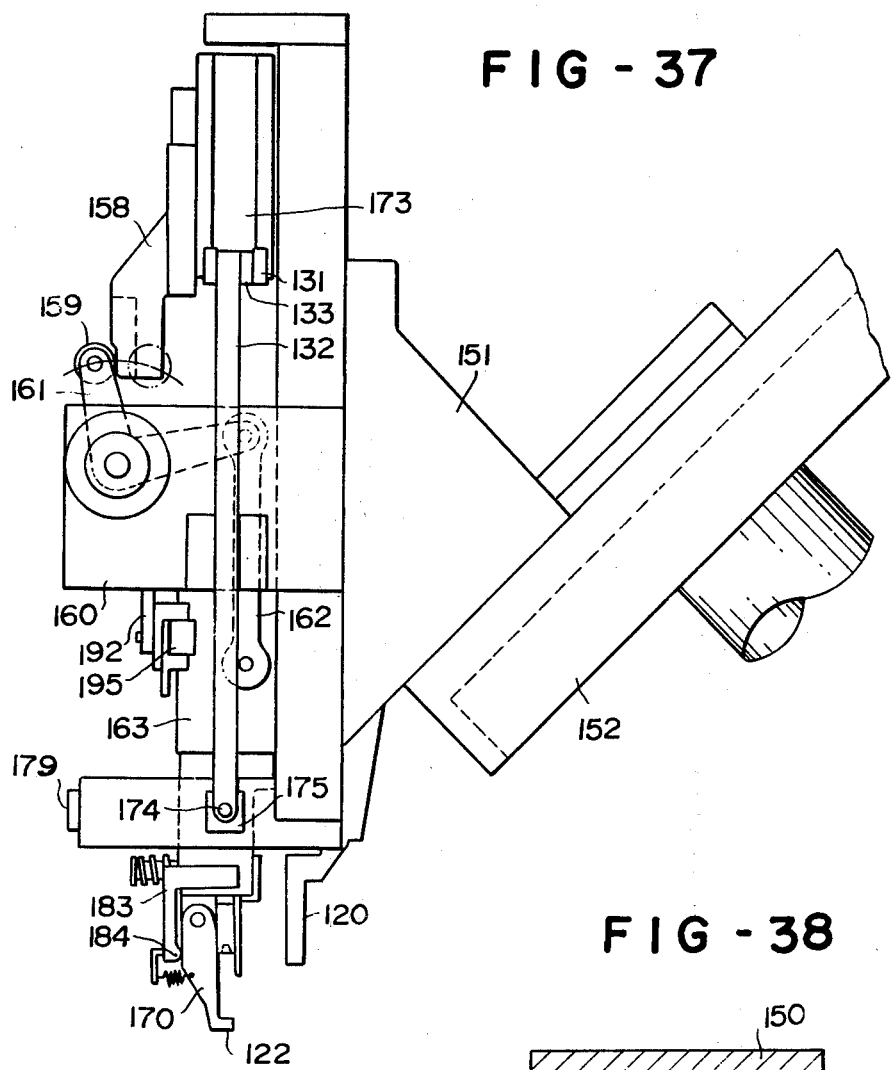
FIG. 37 is an elevational view of insert assembly depicted in FIG. 35.
Figure 38:
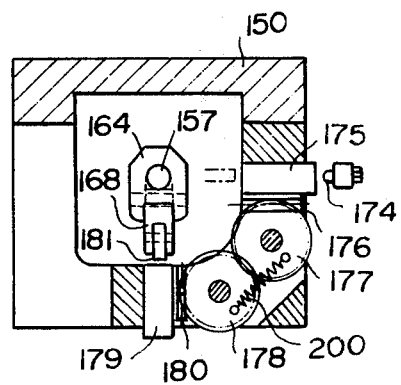
FIG. 38 is a sectional view taken along line VII—VII of FIG. 35.

With particular reference to FIGS. 35 and 36, a support frame 150 is secured to a bracket 151, which bracket is secured to a mounting 152, which mounting effects rotatable support of the rotary support holder. In response to a command signal, a cylinder 153 disposed at the top of frame 150 is operated, thereby lowering a movable block 154 along vertical guide rods 155. A push bar 157 is inserted within an opening in the block 154 and is coupled thereto by a spring 156 having a weak spring force so that upon displacement of the movable block in a downward direction, the push bar 157 is also lowered. Additionally, movable block 154 includes an integrally formed cam 158 (best illustrated in FIG. 37) and a roller 159 adapted to be displaced in a counterclockwise direction in response to the downward displacement of movable block 158. Roller 159 is rotatably carried on a bell-crank 161 which bell-crank is pivotally mounted to block 160. Block 160 is integrally formed with the frame 150 and by the rotatable movement of the roller 159, a lower block 163 is slightly elevated by link 162, which link is coupled to the other end of bell-crank 161. A sleeve 164 is mounted on lower block 163 and together with a metal guide 165, a second bell-crank 192, lever 168 pivotally secured to pin 167 at the lower end of sleeve 164, and a lever 170 pivotally secured by a pin 169 to lever 168, are raised by the elevation of link 162. As a result thereof, lead guide 121 and lead holder 122, both provided on the lower end of the lever 168 are raised. Accordingly, an electronic circuit element 17 held by chuck 15 in the position directly beneath the push bar 157 is vertically clamped in the recess in the tip of the push bar 157 between the lead guide 121 and lead holder 122 thereby corresponding to the position illustrated in FIG. 30(c) and accordingly, the chuck 15 is thereafter opened and displaced away from the circuit element.

Thereafter, the block 154 is further lowered to bring the guide element to the position illustrated in FIG. 30(d).

As the block 154 is lowered, the roller 159 clears the cam 158, the lowering of block 154 effecting a corresponding lowering of the lower block 163 until the lower block 163 strikes a stopper (not shown) and thereby stops the downward displacement of the lead guide 121 and lead holder 122, while the upper block 154 continues to be lowered. Since the resistance offered when the leads of the electronic circuit element 17 are urged into contact with the printed circuit board is greater than the spring force of the spring 156, the push bar 157 ceases to be displaced downwardly since the spring 156 is compressed until the head of pin 171 strikes the head of push bar 157, whereupon the electric circuit element 17 is urged into the printed circuit substrate since spring 172 provides a sufficiently strong spring force. Once insertion is completed, the cylinder 153 is retracted to raise the blocks 154 and 163.

As the lead guide 121 and lead holder 122 are raised after completion of the insertion of the leads, they are opened in the manner shown in FIG. 30(f) so that they will completely clear the head of the electronic circuit element 17, the mechanism for achieving this effect being described hereinafter.

The upper block 154 includes a cam 173, which cam during the lowering thereof laterally displaces a roller 131, which roller 131 effects a counterclockwise (FIG. 35) rotation of lever 133 with respect to lever 132, so that lever 132 is not effected thereby. However, when block 154 is raised, as the hill surface of the cam 173 engages the roller 131 in the upward direction, a shoulder portion 134 of the lever 133 strikes the lever 132 thereby effecting rotation of the lever 132 about pin 135 resulting in a push pin 174 contacting a push block 175. As is particularly illustrated in FIG. 38, the push block 175 is provided with a rack 176, which rack is coupled through gears 177 and 178 to a rack 180 provided on a further block 179 extending at a right-angle to the block 175. Accordingly, an inward movement of the push block 175 effects a corresponding inward movement of further block 179. The movement of block 179 effects displacement of a roller 181, which roller is disposed on the inner surface of the block 179 disposed on lever 168, so that lever 168 is displaced by the push block 179. Accordingly, the lever 168 is pivoted about pin 167. The pivoting of lever 168 is opposed by a spring 182 for returning the lever when the force applied to push blade 179 is removed. At the same time, the outward movement of the pin 169 extending frm the lever 168 causes lever 170 to stroke a projection 184 projecting from the end of the stopper 183 to thereby inwardly displace the lead holder 122 secured to the end of the lever 170 to the open position illustrated at 122' in FIG. 36. By this arrangement, contact of the head of the electronic circuit element with the lead guide 121 or with the lead holder 122 is avoided. It is noted that a spring 200 thereby returns the respective gears 178 and 177 to the initial position.

When the electronic circuit element 17 is to be inserted into a circuit board at a right angle to the position at which same is gripped by the chuck 15, it is necessary to effect rotation thereof by 90° about its vertical axis. To effect such rotation, either cylinder 185 or cylinder 186 provided in the block 164 (cylinder 185 in FIG. 39) is actuated by pneumatic pressure means in response to a command signal, whereby lever 187 is rotated about pin 188 to bring a cylinder 189 provided at a first end of the lever 187 to a predetermined position directly above roller 190, said position being illustrated in FIG. 35. Thereafter, the cylinder 189 is operated, thereby forcing rod head 191 to strike and lower the roller 190. Bellcrank 192 is thereby pivoted to permit the opposite forked end 193 to move a pin 194 disposed therein in a rightward direction. Pin 194 is mounted on a rack 195, the rack being slidably supported by a guide rail 196, which guide rail is provided with a slot 197 for permitting movement of the pin 194 therethrough. With the movement of pin 194, rack 195 is moved in the horizontal direction. The rack 195 is disposed in meshing engagement with pinion 198, which pinion is securely fitted on the sleeve 164. The operation of the cylinder 189 therefore effects rotation of sleeve 164 within the metal guide 165 coincident with the movement of push bar 157 and lever 168. The rotational angle of the sleeve 164 is set to 90° by a stopper. The resulting position of the sleeve 164 after a 90° rotation thereof displaces the roller 181 on the direct inner side of the push block 175 so that same is directly operated by the push pin 174 without being under the control of the gears 177 and 178, restoring spring 199 being provided to restore the respective elements to their initial state.

It is noted, that the structure for permitting reorientation of the electronic circuit element 17 to a position 90° with respect to its initial clamp position, renders it possible to design efficient apparatus for securing electronic circuit elements to printed circuit boards and more importantly permits the size of the printed circuit board to be reduced. Furthermore, it is possible to omit the conventional step of resetting the printed circuit substrate on the table in a position of 90° with respect to the previous position, thereby providing further improvements in the operational efficiency thereof.

Reference is now made to FIGS. 3 through 6 wherein the table assembly 11 is illustrated. The table assembly includes an X-Y table unit and a lead cutting and bending sub-assembly, generally indicated as 201. The X-Y table assembly, particularly illustrated in FIGS. 3 through 6 includes a Y-table 203 adapted to be moved along guide rails on a lower base 202 in a direction perpendicular to the plane of the paper upon which FIG. 3 is illustrated by an appropriate cylinder drive or pulse motor, and an X-table 204, which table can be moved along guide rails on the Y-table 203 within a horizontal plane in directions perpendicular to the directions of movement of the Y-table 203 also by appropriate cylinder drive or pulse motor mechanisms. Thus, the table assembly 11 permits the printed circuit board mounted on the X-table 204 to be brought to a desired position by coordinate movement of the X and Y tables 204 and 203 at right-angles with respect to each other.

Figure 41:
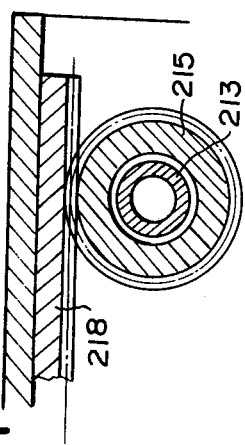
FIG. 41 is a sectional view taken along line IX—IX of FIG. 40.
Figure 39:
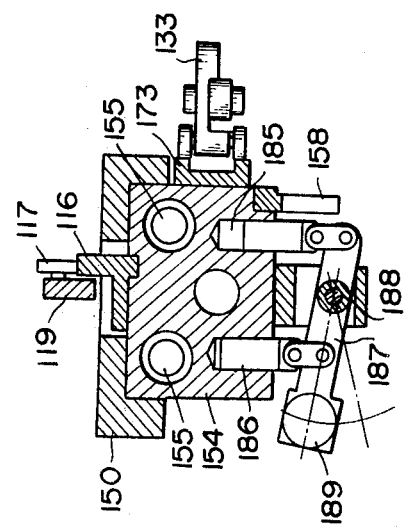
FIG. 39 is a sectional view taken along line VIII—VIII of FIG. 35.
Figure 40:
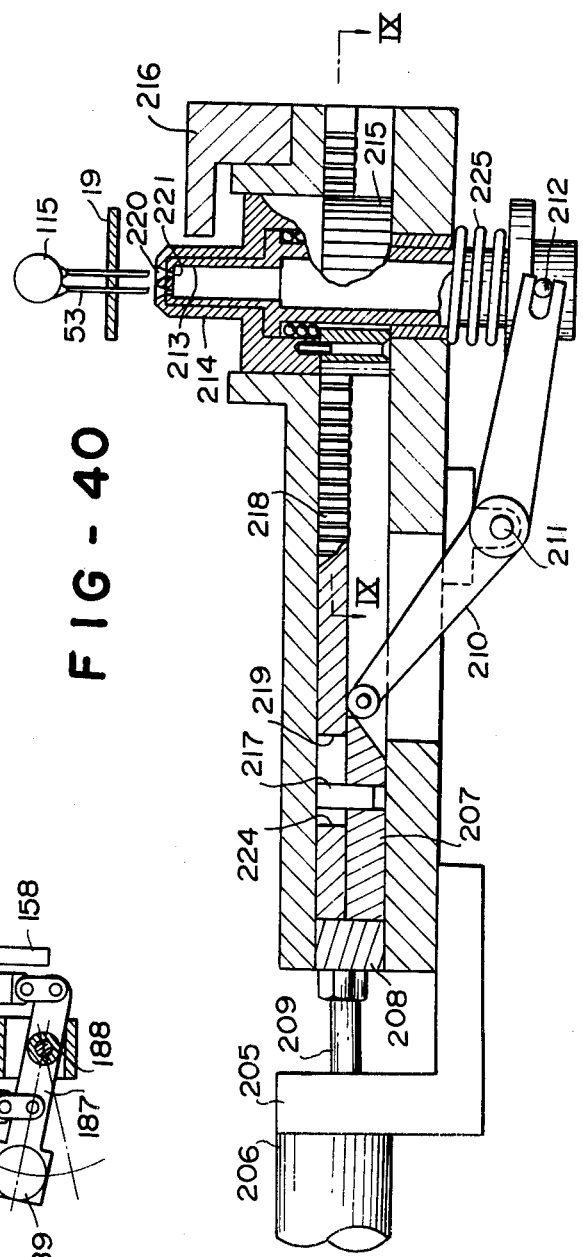
FIG. 40 is a sectional view of a lead cutting and bending sub-assembly constructed in accordance with a preferred embodiment of the instant invention.

The cutting and bending sub-assembly 201 is disposed directly beneath the insert assembly 10 and serves to cut any extra portions of the leads extending from the rear surface of the printed circuit board and further effects bending of the remaining lead portions. Referring specifically to FIGS. 40 and 41, the parallel leads 53 of the disc-shaped capacitor circuit element 115 are inserted through the openings in the circuit substrate 19, whereafter a cylinder 206 secured to frame 205 is displaced toward the position of the circuit element in response to a lead cut-off command signal received thereby. The displacement of the cylinder 206 causes block 208 secured to a cam 207 to be moved by a rod 209. The cam face of cam 207 is oriented so that arm 210 is rotated about a pin 211 in the counterclockwise direction until the arm 210 becomes detached from the cam 207. The movement of the arm 210 is articulated by pin 212 to a non-rotational mold 213 and a rotational mold 214 thereby causing upward movement of a pinion to an upper set position determined by stopper 216. Additionally, a boss 217 contacts an end wall 219 of a slot formed in the rack and effects advancement of the rack 218. The pinion 215 and rotation mold 214 are rotated in response to the rack 218 being advanced, thereby servering the portions of the lead 53 by the blades 220 of the rotational mold 214 and blades 221 of the nonrotational mold 213. Thereafter, the rack 218 continues to be advanced causing a continued clockwise rotation of the pinion 215 and rotational mold 214. The remaining lead portions 53 are therefore guided by the walls of the chamfered portions 222 illustrated in FIGS. 42 and 43 and hence are bent by the subtley curved surfaces 223 of the chamfers 222, more specifically depicted in FIG. 43. Once bending of the leads 53 is effected, the cylinder 206 is displaced away from the circuit element thereby carrying block 208 therewith until the boss 217 strikes the end 208 of the slot in the rack 218 to return the rack and thereby rotate the pinion 215 in the counterclockwise direction. Simultaneous therewith, cam 207 effects rotation of the arm 210 about pin 211 in a clockwise direction under the biasing force of a spring 225 to thereby lower the non-rotational mold 213, rotational mold 214 and pinion 215 so that the cylinder is returned to the initial position to thereby complete an entire machine cycle of the instant invention.

Figure 44:
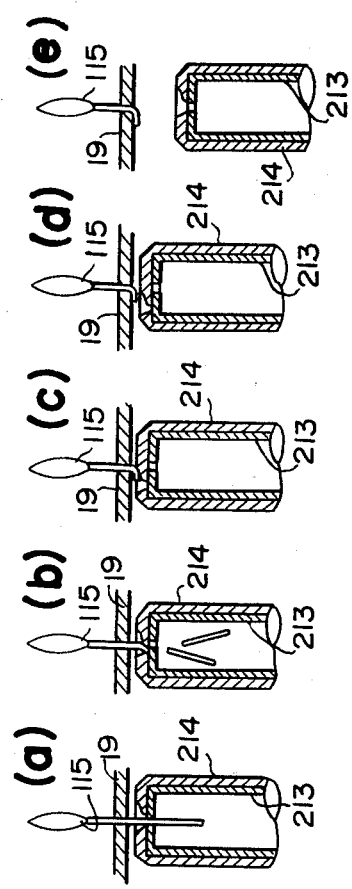
FIGS. 44(a) through 44(e) illustrate the operating sequence of the lead cutting and bending sub-assembly depicted in FIG. 40.
Figure 45:
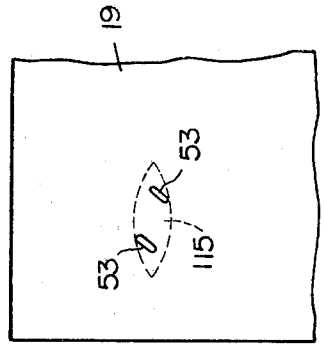
FIG. 45 is a rear surface view of a printed circuit board after the operation of the insert assembly is completed.

Referring specifically to FIGS. 44(a) through 44(e), the sequence through which the parallel leads 53 are inserted into the openings in the printed circuit board 19 to effect cutting and bending thereof is depicted. Initially, as depicted in FIG. 44(a) the leads 53 are inserted between the respective blade of the non-rotational and rotational molds 213 and 214. Thereafter, FIG. 44(b) illustrates a state where the extra portions of the leads 53 are cut off by rotation of the rotational mold 214, whereafter the remaining leads 53 are bent in mutually opposite directions by the chamfered portions 222 of the rotational mold 214, as is illustrated in FIG. 44(c). Once the bending of the leads 53 is completed, as depicted in FIG. 44(d) the rotational mold 214 and nonrotational mold 213 are displaced away from the circuit board and element affixed thereto to thereby leave the element secured to the circuit board at the rear surface thereof in the manner illustrated in FIG. 45.

Figure 42:
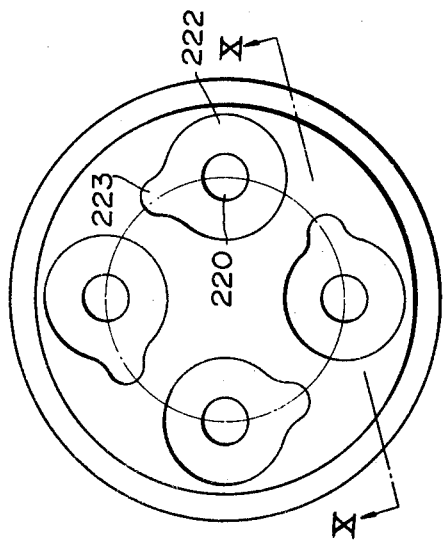
FIG. 42 is a plan view of a cutter of the lead cutting and bending sub-assembly depicted in FIG. 40.
Figure 43:
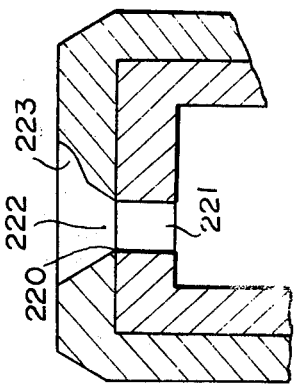
FIG. 43 is a sectional view taken along line X—X of FIG. 42.

It is noted that although the cutting and bending sub-assembly can obtain the functions disclosed by providing two blade receiving openings so that the respective leads can be inserted into the respective blade receiving openings, in order to facilitate correspondence of the blade openings to the leads when the set state of the printed circuit substrate is changed by 90°, it is particularly effective to provide each mold with four blade openings as particularly illustrated in FIG. 42 or to utilize a combination of molds having blade openings when the circuit element has more than two parallel leads.

It is noted that the machine assembly detailed above renders it possible to obtain highly efficient and precise processing and securing of electronic circuit elements to a circuit substrate, such as a printed circuit board, without requiring subsequent changing of the position of the elements, thereby furthr insuring that soldering in the next step of formation will be effective. Moreover, the extra lead portions cut off can be easily collected to prevent any contamination of the machine process thereby, and additionally permit reuse thereof.

It is further noted that whereas the prior art was characterized by an exclusive insert machine being required for each type of electronic circuit element to be secured to a printed circuit board, the instant invention permits a single machine to effect automatic insertion of the electronic circuit elements into a printed circuit board in a sequential manner by merely supplying the NC programmer with an appropriate program.

It will thus be seen that the objects set forth above, among those made apparent from the preceding description are efficiently attained and, since certain changes may be made in the carrying out the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. A machine for processing and inserting parallel lead circuit elements into lead receiving openings in a circuit substrate comprising in combination;
    supply means for selectively supplying one group of a plurality of distinct groups of parallel lead circuit elements to appropriate circuit element selection means and circuit element selection means for selecting one of said circuit elements from said selected group of circuit elements supplied thereto by said supply means;
    transfer means for receiving from said circuit element selection means each circuit element selected thereby and for displacing same to a release position, said transfer means including chuck means for gripping said selected and supplied circuit element during receipt and displacement thereof to said release position;
    insert means including release means operatively disposed to engage said chuck means and effect release of said circuit element gripped thereby when said chuck means is displaced to said release position, and plunger means adapted to engage said circuit element at said release position and displace said circuit element from said release position to an inserted position; and
    board handling means for disposing said lead receiving openings in said circuit substrate in alignment with said circuit element so that said parallel leads of said respective circuit elements are received in said receiving openings when same are displaced to said inserted position.

2. A machine as claimed in claim 1, wherein said insert means includes holding means adapted to grip said circuit element when same is displaced to said release position by said transfer means and continues to grip said circuit elements during displacement by said plunger means from said release position to said inserted position, and hold releasing means for releasing the grip of said holding means when said parallel leads are displaced to said inserted position.

3. A machine as claimed in claim 2, wherein said board handling means includes lead bending means for bending the ends of said parallel leads projecting through said openings in said circuit substrate when said circuit element is displaced to said inserted position.

4. A machine as claimed in claim 3, wherein said lead bending means further includes cutting means for cutting away portions of said parallel leads extending through said openings in said circuit substrate prior to the bending of the remaining portions of said leads extending through the openings in said circuit substrate.

5. A machine as claimed in claim 2, wherein said supply means includes distribution means for selectively distributing each of said groups of parallel lead circuit elements, index means for indexing said distribution means to select one of said groups of said parallel lead circuit elements and applying same to said circuit element selecting means.

6. A machine as claimed in claim 5, wherein each of said groups of parallel lead circuit elements includes transport means for transporting said circuit elements in sequence, said distribution means being adapted to receive each of said transport means and sequentially advance said one transport means selected in response to each supplying of a circuit element by said selecting means.

7. A machine as claimed in claim 6, wherein said transport means includes a plurality of elongated carriers having said circuit elements secured thereto, said distribution means including a plurality of stacked transport shelves, one for each said elongated carrier.

8. A machine as claimed in claim 7, wherein said index means includes lateral displacement means laterally displacing one of said shelf means when said one shelf means is elevated to a laterally displaceable position, and column means for selectively raising and lowering said stacked transport shelves to thereby bring one of said stacked transport shelves to said laterally displaceable position, said lateral displacement means being adapted to displace said stacked shelf position thereat to a carrier feeding position to effect feeding of the selected elongated carrier to said selecting means.

9. A machine as claimed in claim 8, wherein said selecting means includes tape feeding means for incrementally advancing said carrier, and carrier cutting means for cutting said carrier and element carried thereby after each incremental feeding thereof.

10. A machine as claimed in claim 2, wherein said chuck means includes a fixed block supported by said transfer means, a first movable block slidably engaged in said fixed block, a second movable block slidably engaged in said first movable block, and engagement means for effecting relative movement of said first and second movable block, said second movable block including a fixed claw formed thereon, said second movable block also including movable claws disposed thereon, said movable claws including spring biasing means for biasing said movable claws into one of a closed and opened position for respectively gripping and releasing said supplied circuit element, and further spring biasing means for bringing said second movable block into engagement with said fixed block to define an open position.

11. A machine as claimed in claim 10, wherein each said chuck means includes gripping and releasing positioning means, said gripping and releasing positioning means including engaging means adapted to engage at least one of at least two recesses formed in said first movable block, said first recess defining said closed position and said second recess defining said open position of said movable block.

12. A machine as claimed in claim 2, wherein said transfer means includes rotary support means, a plurality of chuck means peripherally disposed on said rotary support means, and said rotary support means being adapted to rotatably increment said chuck means to grip each supplied circuit element and rotatably transfer same to said release position.

13. A machine as claimed in claim 12, wherein said rotary support means includes intermittent rotary drive means for intermittently driving said rotary support means through a fixed rotational angle for each rotational increment thereof.

14. A machine as claimed in claim 13, wherein said rotary drive means includes rollers peripherally disposed around said rotary support means and a barrel cam having oriented circumferential grooves therein for engaging said peripherally disposed rollers, a first portion of said grooves being aligned in parallel with an imaginary plane perpendicular to the axis of said cam, the remaining portion of said circumferential grooves being disposed at an incline with respect to said imaginary plane perpendicular to the axis of said cam.

15. A machine as claimed in claim 2, wherein said insert means includes lead guide means having grooves for receiving and directing the circuit element parallel leads, lead holder means adapted to cooperatively engage said lead guide means and thereby effect a gripping of said circuit element parallel leads therebetween, said plunger means including a push bar adapted to engage said circuit element when same is gripped by said lead guide means and lead holder means and displace said circuit element parallel leads to said inserted position under the guiding control of said lead guide means.

16. A machine as claimed in claim 15, wherein said lead guide means, lead holder means and push bar are adapted to be rotated about the vertical axis to effect angular reorientation of said circuit element prior to displacement of same from said release position to said inserted position.

17. A machine as claimed in claim 4, wherein said lead bending and cutting means includes a first rotatable mold having a plurality of spaced blade holes, each of said blade holes defining a cutting edge surface facing in the direction through which said rotatable mold means is adapted to be rotated, said edged surface terminating in a subtly curved surface, and a non-rotatable mold coaxially disposed with respect to said rotatable mold, said non-rotatable mold including the same number of blade holes as said rotatable mold, the blade holes in said non-rotatable mold being aligned with the blade holes in said rotatable mold when said circuit element is displaced from said release position to said inserted position.

18. In a machine for automatically inserting parallel lead type circuit elements into openings in a printed circuit board, the improvement comprising supply means for selectively supplying to appropriate circuit element separating means a group of electronic circuit elements from a plurality of groups of electronic circuit elements, said element supply means including a shelf sub-assembly consisting of a plurality of shelves stacked one above the other, each said shelf being adapted to support one of said groups of electronic circuit elements, vertical drive means for displacing said shelf subassembly in the vertical direction, horizontal drive means for displacing one of said shelves in the horizontal direction, tape feeding means for incrementally feeding said group of electronic circuit elements disposed on said horizontally displaced shelf, and separating means for sequentially separating an electronic circuit element from said group of electronic circuit elements in response to each incremental feeding thereof.

19. In a machine for automatically inserting parallel lead circuit elements into openings in a printed circuit board, the improvement comprising transfer means for selectively gripping and transferring said electronic circuit element, said transfer means including a plurality of chuck means, each said chuck means comprising a fixed block, a first movable block slidably engaged in said fixed block, a second movable block slidably engaged in said first movable block, engagement means for effecting relative movement of said first and second movable blocks with respect to each other, said second movable block including a fixed claw formed thereon, said second movable block further including at least two movable claws disposed thereon, said movable claws including spring biasing means for biasing said movable claws into one of a closed and open position for respectively grpping and releasing said supplied circuit element, and further spring biasing means for bringing said second movable block into engagement with said fixed block to define an open position.

20. A machine as claimed in claim 19, wherein each said chuck means includes gripping and releasing means, said gripping and releasing means including engaging means adapted to be engaged in at least one of at least two recesses formed in said first movable block, said first recess defining a gripping position of said second movable block and said second recess defining a release position of said second movable block.

21. A machine as claimed in claim 19, wherein said transfer means further includes rotary support means, a plurality of chuck means peripherally disposed on said rotary support means to be rotationally transferred thereby, said rotary support means including intermittent rotary drive means for intermittently driving said rotary support means through a fixed rotational angle for each rotation thereof, said rotary drive means further including rollers peripherally disposed around said rotary support means and a barrel cam having oriented circumferential grooves therein for engaging the peripherally disposed rollers on said rotary support, a first portion of said grooves being aligned parallel to an imaginary plane perpendicular to the axis of said cam, the remaining portion of the circumferential grooves being disposed at an incline with respect to said imaginery plane perpendicular to the axis of said cam.

22. In a machine for automatically inserting parallel lead type circuit elements into openings in a printed circuit board, the improvement comprising insert means for receiving a circuit element at a predetermined position and inserting same to an inserted position, said insert means including lead bending and cutting means, said lead bending and cutting means including a first rotatable mold having a plurality of spaced blade holes, each said blade hole including a cutting edge surface facing in the direction through which said rotatable mold is adapted to be rotated, said cutting edge surface terminating in a subtly curved surface, and a non-rotatable mold coaxially disposed with respect to said rotatable mold, said non-rotatable mold including the same number of blade holes as said rotatable mold, the blade holes in said non-rotatable mold being aligned with the blade holes in said rotatable mold when said element is displaced from said predetermined position to said inserted position.

* * * * *